(12) United States Patent
Doty

(10) Patent No.: US 10,078,120 B2
(45) Date of Patent: Sep. 18, 2018

(54) TUNABLE MICROWAVE RESONATOR FOR STATIC DYNAMIC NUCLEAR POLARIZATION (DNP)

(71) Applicant: Doty Scientific, Inc., Columbia, SC (US)

(72) Inventor: David Doty, Columbia, SC (US)

(73) Assignee: DOTY SCIENTIFIC, INC., Columbia, SC (US)

( * ) Notice: Subject to any disclaimer, the term of this patent is extended or adjusted under 35 U.S.C. 154(b) by 192 days.

(21) Appl. No.: 15/112,661

(22) PCT Filed: Jan. 20, 2015

(86) PCT No.: PCT/IB2015/050447
§ 371 (c)(1),
(2) Date: Jul. 19, 2016

(87) PCT Pub. No.: WO2015/107512
PCT Pub. Date: Jul. 23, 2015

(65) Prior Publication Data
US 2016/0334476 A1    Nov. 17, 2016

Related U.S. Application Data

(60) Provisional application No. 61/929,468, filed on Jan. 20, 2014.

(51) Int. Cl.
*G01V 3/00* (2006.01)
*G01R 33/28* (2006.01)
*G01R 33/38* (2006.01)

(52) U.S. Cl.
CPC .......... *G01R 33/282* (2013.01); *G01R 33/38* (2013.01)

(58) Field of Classification Search
CPC .................. G01R 33/282; G01R 33/38
(Continued)

(56) References Cited

U.S. PATENT DOCUMENTS 6,535,755 B2 *  3/2003  Ehnholm .......... G01R 33/62
                                           324/318
2005/0280415 A1  12/2005  Hofmann et al.
(Continued)

OTHER PUBLICATIONS

Written Opinion of the International Searching Authority for PCT/IB2015/050447, dated Apr. 22, 2015.
(Continued)

*Primary Examiner* — Reena Aurora
(74) *Attorney, Agent, or Firm* — Oppedahl Patent Law Firm LLC

(57) ABSTRACT

A tunable millimeter-wave (mmw) DNP probe head is disclosed that is compatible with efficient H/X/Y/e⁻ DNP in samples that may have volume large compared to $\lambda_0^3$, where $\lambda_0$ is the free-space wavelength at the frequency $f_e$ of the electron paramagnetic resonance (EPR) when placed in an external polarizing field $B_0$, where $B_0$ is typically in the range of 6.5 T to 35 T, corresponding to $f_e$ in the range of 180-1000 GHz, and corresponding to proton resonance frequency $f_H$ in the range of 280 MHz to 1500 MHz. The probe head comprises a tune cavity of adjustable volume, a sample cavity that is large compared to the sample wavelength, a tapered conical feed transition filled with a high dielectric material at the small end, and a selectively reflective wall that is substantially reflective of electromagnetic radiation at $f_e$ but substantially transparent to electromagnetic radiation at $f_H$.

19 Claims, 12 Drawing Sheets

(58) Field of Classification Search
USPC .......................................................... 324/309
See application file for complete search history.

(56) References Cited

U.S. PATENT DOCUMENTS

| | | |
|---|---|---|
| 2007/0007961 A1 | 1/2007 | Habara et al. |
| 2007/0038076 A1 | 2/2007 | Osada et al. |
| 2009/0085562 A1 | 4/2009 | Strange et al. |
| 2011/0050225 A1* | 3/2011 | Prisner .................. G01N 24/12 324/307 |
| 2013/0207656 A1 | 8/2013 | Shinagawa et al. |

OTHER PUBLICATIONS

International Search Report for PCT/IB2015/050447, dated Apr. 22, 2015.

* cited by examiner

TUNABLE MICROWAVE RESONATOR FOR STATIC DYNAMIC NUCLEAR POLARIZATION (DNP)

FIELD OF THE INVENTION

The field of this invention is an improved resonant structure for facilitating Dynamic Nuclear Polarization (DNP) Nuclear Magnetic Resonance (NMR) with dramatically reduced microwave power requirements and dramatically increased signal to noise for liquid or solid samples, generally using non-dissolution methods, typically in the temperature range of 20 K to 330 K.

BACKGROUND OF THE INVENTION

NMR is probably the most powerful and widely used analytical technique for structure determination and function elucidation of molecules of all types, but it suffers from low sensitivity, particularly for insoluble biological macromolecules. Dynamic Nuclear Polarization (DNP) with Magic Angle Spinning (MAS) has recently demonstrated signal to noise (S/N) gains exceeding two orders of magnitude at ~100 K compared to conventional MAS-NMR in many biological solids.

It is important at the outset to distinguish between two very different NMR techniques often just called DNP for short. There is dissolution-DNP and non-dissolution DNP, the latter of which has usually been the subset of methods classified as MAS-DNP at ~100 K. The novel resonator disclosed herein is expected to be relevant to non-dissolution DNP.

Briefly, the dissolution method permits increased S/N in MRI and in NMR of liquids by hyperpolarizing an agent at a low temperature (usually below 4 K) by irradiation at the electron paramagnetic resonance (EPR) frequency in a lower-field magnet (usually 1 to 3.5 T); and then quickly heating (and melting) it, and rapidly transporting it to and injecting it into an animal or a liquid sample in a higher field magnet (usually 3-21 T) several meters away, where the NMR methods are carried out in a completely separate NMR detection system in the few tens of seconds available before the hyperpolarization decays.

In non-dissolution methods, microwave (MW—note the common non-SI abbreviation) irradiation, or more properly millimeter-wave (mmw) irradiation takes place within the same resonator as the NMR detection—at the same field, and almost always at the same temperature (though there have been a few attempts to cycle the temperature between the mmw and the NMR events).

In non-dissolution high-field DNP methods, it is advantageous to utilize a resonator design that achieves high efficiency at the mmw frequency (typically 190 to 600 GHz) and at the several NMR frequencies (typically 30 to 900 MHz) simultaneously. A primary cavity design objective then would be to obtain the highest possible efficiency in generation of EPR $B_{1S}$ throughout a moderately lossy sample of sufficient volume in a way that it can also be very efficiently irradiated with intense rf fields at two or three NMR frequencies. Yet, no previous multi-tuned DNP experiments have utilized cavities, and the $^1$H nanoliter-volume DNP experiments where micro cavities have been utilized (on samples much to small to be useful for most purposes) showed poor baseline NMR performance in S/N and poor spectral resolution.

Detailed simulations of the novel Doty DNP cavity using state-of-the-art microwave simulation software (COMSOL), along with preliminary validation experiments, have shown the potential for achieving the needed electron spin saturation in large samples from mmw irradiation with about two orders of magnitude lower MW power than seen in existing MAS-DNP designs for samples of similar volume (0.1-10 μL) and sample conductivity $\sigma_s$ (0.1-1 S/m) at the same $B_0$ and temperature.

It has often been stated that MAS-DNP will permit four orders of magnitude reduction in signal acquisition time in many solids NMR applications. Granted, that may be a bit of hyperbole—mostly because of unavoidable concomitant changes in spectral linewidth ($1/T_2^*$), spin-lattice relaxation time ($T_1$), sample volume, sample dilution (from the matrix and polarizing agent), and sample preparation and changing difficulties. Still, the DNP promise is enormous, as witnessed by the exponential growth in solids-DNP publications over the past four years.

Despite the enormous potential benefit, the adaptation rate of MAS-DNP has been severely limited by its very high price tag (currently $1.8-4M). The driver of the exceedingly high price for existing DNP capabilities is the "need" for a gyrotron. The gyrotron has been believed to be the only mmw source capable of providing the power levels required for the desired DNP methods. The novel resonator disclosed herein will render, in many cases, the gyrotron to be unnecessary by allowing for much less expensive low-power solid-state sources. At the same time, it will enable the use of much larger sample volumes with multi-tuned multi-nuclear (H/X/Y/e−) circuits that have much higher efficiency and S/N.

The focus of the resonator design disclosed herein is for static DNP experiments—non-spinning and non-dissolution. This is an area that has thus far received much less attention than MAS-DNP. Preliminary simulations suggest that extensions of some of the concepts disclosed herein may also permit dramatic increases in efficiency of MAS-DNP, and such innovations are expected to be the subject of a future patent application.

While the novel tunable DNP cavity disclosed herein is directly compatible only with static DNP methods, the samples can be solids, liquids, or semi-solids. Granted, the linewidths from static solids NMR techniques are always much greater than in MAS. However, static high-power NMR methods have been similarly successful in yielding structures of large, complex, helical membrane proteins from the correlated dipolar and anisotropic chemical shift data such methods uniquely provide [1].

Thin glass plates were initially used to achieve the protein alignment needed to obtain high resolution of membrane proteins in lipid bilayers. Another option is to insert the proteins into large bicelles, which are magnetically anisotropic and thus self-align when placed in solution in an external magnetic field [2]. While bicelles provide a native-like environment for the incorporated membrane proteins [3, 4], their composition is restricted to a very limited repertoire of lipids. As an alternative, it has been shown that anodic aluminum oxide (AAO) nanopores can readily be fabricated that provide highly homogeneous and ordered nano-templates for aligning an exceptionally broad range of lipids [5, 6]. Such nanoporous substrates provide the very large surface area required for the NMR studies, and have additional advantages with respect to control of the biophysical environment and improving microwave efficiency in the novel cavity, as will become clear later.

While dissolution DNP methods can be applied to lossy liquid samples near room temperature (RT), they are not likely to be very useful for structure determination of macromolecules, and they come with major complications—not the least of which are the requirements of a second superconducting magnet, sub-4-K cooling of the polarizing agent, the rapid shuttling and heating systems, and the poor compatibility with time averaging.

On the other hand, non-dissolution DNP is not easily applied to lossy liquid samples near RT, largely because electron $T_1$'s are usually several orders of magnitude shorter than those of $^1H$. Hence, much higher $B_{1S}$ is required to saturate the electron spins. At the same time, the effective sample conductivity at RT may be five times higher than that at 100 K, further exacerbating the microwave heating problem. This is a major limitation of DNP, since most structure determinations utilize liquids methods. When available methods are applied to very large macromolecules at low concentrations, the signal acquisition time can still be measured in weeks, even at 21 T. It could be quite beneficial if DNP enhancements could be effectively applied to real problems in liquids NMR methods. Unfortunately, the spectral resolution of MAS-DNP in frozen solutions at 100 K is usually two orders of magnitude worse than required by liquids methods.

Substantial gains in S/N from high-field DNP have been demonstrated in liquids above RT at 9.2 T, but only for single-resonance $^1H$ NMR in sample volumes in the range of 3-100 nL—and with very poor spectral resolution [7, 8]. In one case, a factor of 30 gain in S/N was demonstrated with a $B_{1S}$ of 640 µT [7], but in the other case, a factor of 80 gain was seen with the more practical $B_{1S}$ of only 350 µT [8]. If significant biological applications of DNP are to be realized in lossy liquid samples, it will be necessary to dramatically reduce the mean ratio of $E/B_{1S}$ within the sample while simultaneously addressing the issues of achieving very high $B_0$ homogeneity, efficient triple resonance rf, and effective heat removal from the unavoidable microscopic hot spots within samples of useful size (several µL). All of these issues can be more optimally addressed in the cavity disclosed herein, thereby enabling "high resolution" DNP-NMR in liquid samples near RT. Indeed, resolution will still be more than an order of magnitude away from state-of-the-art liquids NMR resolution, but sometimes an order of magnitude better than seen in MAS-DNP at 100 K.

Prior DNP Resonators. Nanni et al reported achieving $B_{1S}$ of ~25 µT (corresponding to ~0.73 MHz $\gamma B_{1S}$) for 4 W (incident onto the rf coil) at 250 GHz in a 4 mm rotor over a short sample length, for which a factor-of-100 gain in S/N was observed for a particular example at ~100 K [9]. They also show a curve for enhancement vs field strength, from which one deduces that half of this microwave field strength (i.e., ~1 W incident power) would give a DNP enhancement factor $\in_{DNP}$ of ~50. The typical frozen sample has been reported to have relative permittivity $\in_r$=3.5 at 140 GHz and 77 K, with loss tangent of 0.005 [9], which would be equivalent to a conductivity $\sigma_s$ of 0.14 S/m. The figures in their papers show the microwaves being launched from a horn transversely onto the rf coil that surrounds the rotor. They show results of a single-pass analytical model and a highly simplified HFSS simulation, both of which assume there is no cavity or resonator effect at the MW frequency. They reported MW conversion factor $g_{MW}$ of ~12 µT/W$^{1/2}$, though for an unclear sample volume. Their models suggest the sample volume receiving substantial irradiation in this $^1H/^{13}C/^{15}N/e^-$ MAS-DNP probe [10] may have been about 6 µL, though our more detailed simulations indicated a much larger sample—perhaps 25 µL—was being well irradiated, for which the time-averaged $B_{1S}$ was much more uniform than seen from their models.

Details of commercially available MAS-DNP probes do not seem to be publicly available, but those by Bruker (the only current commercial supplier of complete MAS-DNP systems) are widely known to be heavily based on collaborations with the Griffin group at MIT, and the information that is available indicates their MW performance is similar to that reported in the above and other publications from the MIT group.

Prisner and Denysenkov disclose in WO 2009/12160 a micro "Fabry-Perot" resonator built on a reflective rf stripline with an effective sample volume of ~0.1 µL. (We note that "Fabry-Perot" is not very descriptive, and the term has been applied loosely to a wide range of types of resonators.) They reported achieving MW conversion factor 370 µT/W$^{1/2}$ at 260 GHz for a 100 mM saline solution near RT, where the sample conductivity would be ~1 S/m [11, 12]. The loaded Q of the microwave resonator was ~200. The ultra-low inductance of the stripline used for the $^1H$ resonator would make efficient double-tuning of such a coil (for example, for $^1H/^{15}N$) impractical. Moreover, the sample volume is a factor of 10-200 below what would be needed for sufficient S/N for 3D NMR structure determination methods to be practical on macromolecules, and their spectral resolution (~0.1 ppm) was an order of magnitude worse than what is desired. It appears that their stripline generated a 25 µs π/2 pulse for $^1H$ at 1 W at 392 MHz.

Neugebauer, Prisner et al report $g_{MW}$ up to 450 µT/W$^{1/2}$ at 260 GHz using a small helical resonator with sample volume up to 3 nL and a loaded Q up to 400 [12]. Here, the sample volume is three orders of magnitude smaller than needed for insensitive nuclides and the spectral resolution was ~0.3 ppm.

Feintuch, Goldfarb et al report up to 830 kHz (~29 µT) at ~0.3 W, or $g_{MW}$~50 µT/W$^{1/2}$ at 95 GHz using a horn-mirror-Helmholtz arrangement with a total sample volume of ~30 µL [13]. In this case, the rf coil was well outside the microwave region, so rf performance was very poor by conventional standards. It appears that it probably required ~500 W to achieve a $^1H$ π/2 of 3 µs (~2 mT), though the reporting was not clear. The fraction of the sample actually experiencing something close to the peak MW transverse magnetic field was not reported. An estimate is that probably 5-10 µL was seeing 25-35 µT $B_{1S}$ at 0.3 W of incident MW power.

In U.S. Pat. No. 7,292,035, Habara and Park disclose the use of a sample tube co-axially inside a leaky "Fabry-Perot" type cavity formed by two concave mirrors with a micro-solenoid surrounding the confocal space between them [14]. The disclosure envisions the use of a 3-mm glass sample tube at 200 GHz, with mirrors and solenoid about an order of magnitude larger in diameter. No performance calculations or data are provided, but an estimate based on analogy to work by the Prisner group is that perhaps $g_{MW}$ up to ~20 µT/W$^{1/2}$ could be expected. However, the poor performance of the NMR rf coil (in either embodiment) would lead to very poor DNP performance.

In patent application publication US 2009/0121712, Han et al disclose a method of obtaining improved sensitivity on boundary layer water interacting with interfacial molecular assemblies by attaching a nitroxide to a surface layer to permit DNP enhancement of the surface water [15]. In experiments at 4.2 K, this group irradiated a 50-µL sample in a polyethylene cup from the end of a 5.3 mm corrugated waveguide at 200 GHz. A mirror on the opposite side of the sample reflected most of the transmitted microwaves back through the sample, but otherwise there was no attempt at confinement [16]. Apparently, no attempt was made by the inventors to determine a conversion factor, but an estimate based on relative dimensions and other considerations is that the average value was probably less than that obtained by Nanni et al.

In WO 2013/057688, Macor et al disclose the use of a photonic band gap (PBG) resonator fed co-axially with BO by a corrugated waveguide with a co-axial central sample tube surrounded by a birdcage resonator for the rf [17]. This represents one of the first highly innovative attempts to use a mmw resonator with an rf resonator in a way that may permit significant advantages compared to variations on the brute-force methods from the 1970's (Yannoni, Wind, Maciel, and others). No conversion factors for any of the Macor embodiments were reported. Our simulations showed the potential of such resonators to achieve substantial improvement in $g_{MW}$, but at the expense of many of the other DNP cavity design objectives listed further down in this background material.

Pike et al show a method of axial microwave irradiation at 187 GHz in MAS-DNP by means of quasi-optical mirrors mounted on an essentially standard Doty MAS NMR probe [18]. This illustrates a MW feed method that could reduce some of the challenges associated with the PBG resonator by Macor et al. Again, conversion factors were not reported, but rough simulations indicated somewhat higher $g_{MW}$ than reported by Nanni et al.

In WO 2013/000508, Annino et al disclose novel structures suitable for double resonance at the MW (EPR) frequency and at an rf (NMR) frequency with certain advantages for very thin samples, including arrays of such [19]. In particular, the inventions could be compatible with simultaneous and uniform irradiation by visible or UV light, microwaves, and rf. This could be advantageous for photo-CIDNP, which permits hyperpolarization at room temperature and without paramagnetic centers in the sample, thereby extending the relaxation time of the polarized protons. The inventors also present an excellent overview of the challenges of many of the prior DNP probe heads.

There are rf (discussed later) and other problems with the Annino invention, some of which include the following. There is a failure to appreciate that variable effects in the sample size and its dielectric properties will radically change the MW mode structure, S11, and efficiency relative to that seen for a particular idealized simulation, and anti-reflective coatings will not solve this problem. The susceptibility broadening effects from the grid and flow channels will be substantial, and composite construction will not solve this issue at the scale envisioned.

While the Annino invention could offer the advantage of much better MW field uniformity than generally seen in other DNP probe heads, it should be pointed out that many prior DNP probe heads with quite non-uniform MW fields have worked very well with respect to $\in_{DNP}$. Uniformity of the MW field is apparently not a significant issue in most of the DNP methods that have been developed. Again, apparently, no attempt was made by the inventors to determine a conversion factor for any of the Annino embodiments. The fact that the inventors anticipate an advantage from placing the grid structure inside a confocal Fabry Perot resonator seems to confirm a crude estimate which suggests its $g_{MW}$ in practice will usually not be much better than ~20 µT/W$^{1/2}$, primarily because of the enormous practical difficulty of obtaining low S11 with such resonators when real samples are present.

NMR and EPR S/N Theory. From the classic works, the NMR or EPR S/N from a single 90° pulse at thermal equilibrium with quadrature reception is given by [20]:

$$S/N = 1000 \left[ \frac{\eta^2 \sqrt{2\pi\mu_0}}{12 k_B^{3.2}} \right] \left[ \frac{n_S \gamma I_x (I_x + 1) \sqrt{T_2^*}}{T_S \sqrt{T_R + T_P}} \right] (\eta_E \eta_F Q_L V_S)^{1.2} \omega^{3.2} \quad (1)$$

where $n_s$ is the number of spins per mL at resonance in the spectral line, $T_2^*$ is calculated from the actual linewidth, $T_S$ is the sample temperature, $T_R$ is the weighted average temperature of the circuit coils and capacitors, $T_P$ is the effective preamp noise temperature, $\eta_E$ is the rf circuit efficiency, $\eta_F$ is the magnetic filling factor, $Q_L$ is the loaded and matched circuit quality factor, $V_S$ is the sample volume [mL], and ω is the Larmour precession frequency, $\gamma B_0$. (See reference for more details and definitions [20].) Note, that the derivations here work for both nuclear spins and electron spins. For example, γ=1.76E11/s/T for e$^-$, γ=2.68E8/s/T for $^1$H, and γ=2.7E7/s/T for $^{15}$N.

Most prior DNP work has not paid sufficient attention to maximizing $\eta_F$, $T_2^*$, $\eta_E$, and $V_S$, or to minimizing $T_R$. Part of the reason is that prior to the advent of modern full-wave EM software, it has been very difficult to accurately determine magnetic filling factor, $$\eta_f = \frac{\int_s B_1^2 dV}{2\mu_0 U} \quad (2)$$

where U is the total peak magnetic energy at resonance, $B_1$ is the transverse component of the rotating component of the rf (or mmw) magnetic field, and the integration in the numerator is over the sample space. The following equivalent expression for S/N can be derived for cases where $B_1$ is reasonably uniform throughout the sample:

$$S/N = 1000 \left[ \frac{\eta^2 \pi \sqrt{10\mu_0}}{48 k_B^{3.2}} \right] \left[ \frac{n_S I_x (I_x + 1) V_S \omega^2 \sqrt{T_2^*}}{\tau_{90} T_S \sqrt{P(T_R + T_P)}} \right] \quad (3)$$

where P is the power required to achieve a π/2 pulse length of $\tau_{90}$. Of course, equations 1 and 3 give identical results (where the latter is valid), and in either case a correction factor of ≈0.7 is required for linear polarization. For EPR (and hence for DNP) equation 1 is more useful—because it will generally not be possible to achieve anything close to uniform $B_1$ throughout the sample. The required integrations can be carried out in modern E&M software such as COMSOL RF, and presumably in some other competitive products such as HFSS, CST, Remcom, Maple, FEKO, etc. For the DNP cavity with the port relative reflected power S11 expressed in dB, an appropriate definition of what is called "rf efficiency" in the multi-tuned rf circuit would be $$\eta_E = 1 - 10^{S11 \cdot 10} \quad (4)$$

DNP Cavity Optimization. As noted earlier, the primary objective in DNP cavity design is to generate the highest possible efficiency in producing $B_{1S}$ (at the EPR frequency) throughout a moderately lossy sample of sufficient volume in a way that it can also be very efficiently irradiated with intense rf fields at two or three NMR frequencies. From the above equations, it can be shown that the appropriate mmw cavity optimization Figure of Merit, FOM, is $$FOM = \eta_F Q_L V_S (1 - |S_{11}|) \quad (5)$$

While others have not generally published $\eta_E$, $\eta_F$, $Q_L$, S11, or FOM for their DNP cavities, a few have published maximum $B_{1S}$ (or equivalent) at incident mmw power P. From eq. (3) and other well known relationships, the following can be derived for cases where an effective mean $B_{1S}$ is known over the active $V_S$:

$$FOM = \eta_E \eta_F Q_L = \frac{5\omega V_S B_{1S}^2}{4\pi P} \quad (6)$$

From estimates of the effective mean $B_{1S}$ over the active $V_S$, an FOM can then be estimated for some published DNP cavities, as seen later in Table 1.

Detailed COMSOL simulations indicate the Doty tunable DNP cavities can have FOM 20-2000 times what is seen in the prior art. (Note: EPR S/N would be proportional to the square root of the above FOM at a given $B_0$.)

Circular polarization is certainly useful in MRI. However, circular polarization is generally not used in NMR or in conventional EPR because much more gain in S/N can be achieved by focusing on efficient linear polarization, even when sample losses dominate. The arguments for linear polarization appear to be even stronger for mmw resonators, where it appears to be impractical to incorporate lumped phase shifters (as used in MRI) around the sample at distances small compared to the wavelength within the sample.

Static tunable DNP cavity optimization boils down to the following objectives:
1. The cavity network should achieve maximum mmw FOM (with perhaps some tradeoffs to improve $\eta_F$ at the expense of $Q_L$ and even FOM) at low mmw S11 for a wide range of sample sizes and dielectric properties.
2. The design should be compatible with an rf coil of high $\eta_F$ and suitable inductance (15-150 nH) to permit high NMR S/N (as quantified by eq. 1 or eq. 3) in triple-resonance NMR experiments.
3. The microwave tuning/matching system needs to allow the user to easily and quickly adjust for low S11 at the mmw input port for a wide range of sample sizes, conductivities, and permittivities, both at RT and when the sample is cold inside the magnet, where the sample properties may be very different.
4. It should be reasonably easy for the user to prepare and load samples of various types, into practical sample holders, with sample volumes ranging from 0.01 µL to perhaps even 50 µL at lower fields.
5. Since the sample holders, containers, and their plugs will always constitute a substantial part of the mmw resonant system, it must be practical to reproduce them from suitable materials with high precision at reasonable cost.
6. The design needs to be compatible with all of the conventional NMR and variable temperature (VT) requirements—from perhaps 350 K at least down to 80 K and preferably down to 20 K.
7. It should be practical to manufacture to a very high degree of approximation what is simulated.
8. The design should be able to be scaled for use at all common fields from 6.5 T to 35 T.
9. It should be easy to clean the cavity very thoroughly to eliminate contamination background signals in case of sample leakage.
10. It should be possible to achieve reasonably high microwave $B_1$ homogeneity of predicted magnitude over a sufficiently small sample if it is properly situated.

DNP RF Optimization. The primary focus of the background discussion thus far has been on the mmw side of the design problem, partly because that is what is seen mostly in the patent and professional literature on DNP probe heads—very little attention is usually paid to rf optimization issues, and with predictable results. While rf optimization issues have been well understood by some NMR probe builders for two decades [20], many key issues for maximizing NMR S/N have been ignored in most of the non-dissolution DNP prior art.

The Prisner and Denysenkov approach [7, 11] suffers particularly from extremely small sample volume (~80 nL), very poor $^1$H $\eta_F$ (they required 1 W to achieve a 25 µs π/2 with a nano-sample), poor spectral resolution (0.1 ppm), and incompatibility with even fixed multi-resonance rf tuning (e.g., $^1$H/$^{13}$C). The Feintuch and Goldfarb approach [13] with a much larger sample at low field (3.4 T) still has very poor $^1$H $\eta_F$ (they apparently required ~500 W to achieve a 3 µs π/2). The Habara and Park approach [14] would appear to have even worse $^1$H $\eta_F$, though data are not reported. The Han/Armstrong approach [15] could be adapted to efficient H/X/Y rf (following methods used in the design of liquids NMR probes), but their mmw design has severe limitations with respect to mmw FOM and conversion factor.

Macor et al anticipate the use of many types of rf coils inside their PBG resonator, but they fail to appreciate how difficult it will be to support, tune, and feed the coils without drastically perturbing the desired PBG resonant mode. The rf coil will require very long leads, severely compromising $\eta_E$ in H/X/Y tuning. They show axial mmw irradiation in their PBG resonator, which is probably the only viable option but presents major challenges in sample access.

The Annino novel structures [19] come with what will be show-stopper rf problems in their practical implementation for many applications. The inductance of the parallel-wire rf grid is about two orders of magnitude smaller than what is needed (20-100 nH) for efficient H/X/Y rf tuning. It appears that in one preferred embodiment, the rf parallel wire grid structure would be supported on a micro-tray (apparently ignored in the simulations) that holds the micro-sized planar sample between the rf coil structure and the mirror. For satisfactory rf performance, the rf grid would need to make repeatable contacts with the rest of the structure, with variations in contact resistance and inductance in the micro-ohm and pico-henry range—two orders of magnitude smaller that what is generally considered practical.

The biggest problem with single-tuned rf designs that achieve poor $^1$H $\eta_F$ is that any attempt to extend such a design to H/X/Y (as is essential if DNP is to be fruitful in complex structure determinations) will be disastrous—from the perspectives of both maximum rf field strengths and S/N on the X and Y channels.

The Griffin/Nanni circuit [9, 10] is one of the better solids DNP rf circuits from a S/N perspective, but it still suffers from poor efficiency and high noise temperature on the mid-frequency (MF) and low-frequency (LF) channels for $^1$H/$^{13}$C/$^{15}$N (though it performs very well on $^1$H). The Doty circuit used in the approach by Pike et al [18] is better in these respects, but the Wylde mmw design used there has operational challenges.

For larger samples at high fields, there are strong arguments favoring dual-coil approaches for H/X/Y tuning in solids NMR probes—having the $^1$H on a cross coil and the X/Y on a solenoid [21, 22, 23]. For small samples, the arguments favor tuning a single solenoid to all three frequencies. As the focus of static DNP will usually be on smaller samples, the latter approach may usually be preferred. The losses in rf $Q_L$ arising from the inner mmw cavity also weigh toward the "single-coil" approach. A number of circuits have been used satisfactorily [10, 22], and others will probably be reported in the near future. However, the dual-coil approach (usually an inner solenoid and an outer cross coil [23]) are likely to be preferred in some high-field cases, and the inventive mmw cavity will work splendidly with such.

Laminate reflective shields have been used for nearly three decades in MRI to provide high reflectivity at the MR coil frequencies (typically 64-600 MHz) while achieving very high transparency at the frequencies present in the gradient coil waveforms (mostly 20-3000 Hz). Obviously, six orders of magnitude separate 300 Hz and 300 MHz, so their rf skin depths δ differ by three orders of magnitude. The early methods simply relied on a continuous rf shield that was at least 2δ thick at the rf frequency. This was later found to not have sufficient transparency to the gradient waveforms under some conditions, and composites of overlapping copper patches were found to permit much better transparency at the gradient frequencies with little degradation in reflectivity at the rf frequency, as disclosed by Hayes in U.S. Pat. No. 4,642,569 [24], and later improved by Alecci and Jezzard [25].

SUMMARY OF THE INVENTION

A tunable millimeter-wave (mmw) DNP probe head is disclosed that is compatible with efficient H/X/Y/e⁻ DNP in samples that may have volume large compared to $\lambda_0^3$, where $\lambda_0$ is the free-space wavelength at the frequency $f_e$ of the electron paramagnetic resonance (EPR) when placed in an external polarizing field $B_0$, where $B_0$ is typically in the range of 6.5 T to 35 T, corresponding to $f_e$ in the range of 180-1000 GHz, and corresponding to proton resonance frequency $f_H$ in the range of 280 MHz to 1500 MHz. The invention is based on the discovery of a method that makes it possible to efficiently and easily match complex bounded resonant systems containing dozens of variously shaped dielectric components with hundreds of modes to a mmw source. The probe head comprises:

(A) a mmw port of mean radius greater than $\lambda_0/2$ but less than $\lambda_0$, which feeds
(B) a round metallic tube waveguide transition tapering to a smaller diameter, which feeds
(C) a tune-cavity-feed iris, which transversely feeds
(D) a tune cavity of radius greater than $\lambda_0/2$ but less than $3\lambda_0$, wherein the tune cavity includes an output opening, which feeds
(E) a second round metallic waveguide transition of maximum inner radius less than the tune cavity radius, which feeds
(F) another waveguide transition tapering to a smaller diameter, which feeds
(G) a sample cavity iris, which transversely feeds
(H) a cylindrical sample cavity, having axis within 35° of being transverse to $B_0$ and having radius greater than $\lambda_0/2$ and length greater than $4\lambda_0$, which
(I) is designed to contain a dielectric sample tube containing a dielectric sample to be analyzed.

The tune cavity is further characterized as having effective length adjustable by a movable piston at an end such that the effective tune-cavity length is greater than $\lambda_0$ but less than $500\lambda_0$.

The third waveguide transition is further characterized as being filled with low-loss dielectric material at its smaller end, of relative permittivity $\in_{r3}$ greater than 2 and preferably greater than 7. The sample cavity is further characterized in that most of its surface is substantially reflective of electromagnetic radiation at $f_e$ but substantially transparent to electromagnetic radiation at $f_H$.

The probe head further usually includes a solenoid of at least two turns that is compatible with H/X/Y NMR surrounding the sample cavity but electrically isolated from it and the transitions. The cylindrical wall of the sample cavity has thickness less than $\lambda_0/5$, preferably less than $\lambda_0/20$, and this wall is mechanically supported on the inside of a dielectric coilform, preferably of silicon nitride, that may also on its outside provide mechanical support of the rf coil. The sample cavity walls would preferably be of double-clad laminate with overlapping foil patches such that reflectivity is high at $f_e$ and transparency is high at $f_H$ and lower frequencies.

The sample tube would often be of quartz and be fitted with dielectric plugs in its ends, where the plugs have surfaces that are reflective at $f_e$ which define most of the ends of the sample cavity. The ends of the quartz tube may be metalized to be reflective at $f_e$ and thereby define portions of the ends of the sample cavity.

In many cases, the sample would be in the form of thin sheets or films, possibly contained in thin dielectric trays, stacked transversely within the sample tube. The samples may be liquids or solids, or combinations thereof. Preferably, the relative permittivity of the trays is small compared to that of the sample. The DNP cavity may also be compatible with optical irradiation of the sample.

DETAILED DESCRIPTION

Figure 1:
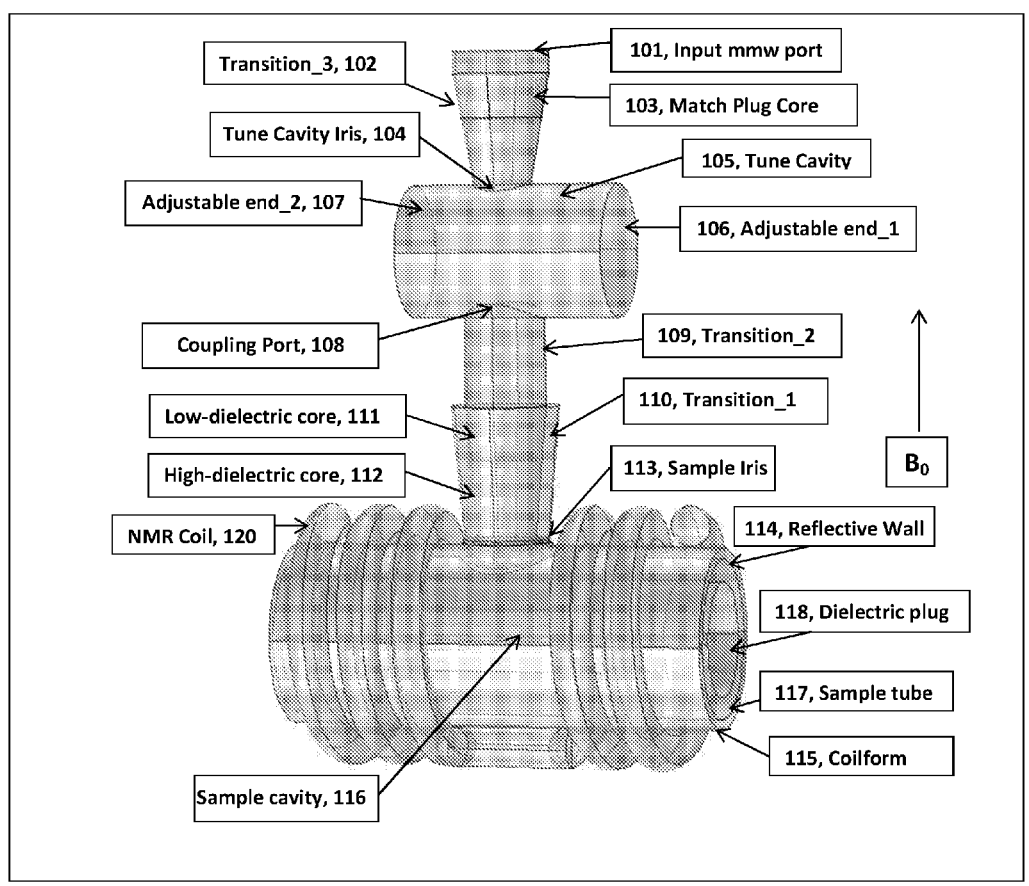
FIG. 1 is a perspective view with surface rendering and transparency of an embodiment of a tunable static DNP cavity.

The perspective surface-rendered view with transparency in FIG. 1 (from a COMSOL simulation at 200 GHz)

provides an overview showing most of the essential components (and some that are not essential) of a generic tunable static DNP cavity, in what is close to the YZ plane.

As is standard practice in the presentation of field simulations, only the boundaries (usually impedance boundaries) of the simulation spaces are shown in most of the figures—with a few exceptions as noted. The bulk metal in the tubes and discs that define the impedance boundaries is irrelevant to the rf simulations—though in some cases it may be relevant to DC magnetic effects. Again, the figures are domain boundaries, which in most cases are the internal boundaries of surrounding metal parts, whose external boundaries are mostly irrelevant.

The probe head including the tunable static DNP cavity is designed to be inserted into the bore of a superconducting magnet generating polarizing field $B_0$, which establishes an approximate EPR frequency $f_e$ and various NMR frequencies, including a $^1H$ at $f_H$.

The mmw source would usually enter the probe head through an overmoded waveguide, possibly corrugated, of radius greater than $1.24\lambda_0$ and preferably greater than $2.5\lambda_0$, according to the prior art, that tapers down, perhaps in several stages, eventually to smooth fundamental mode waveguide, usually circular and of radius less than $0.8\lambda_0$, prior to where FIG. 1 begins. In this drawing (and associated simulations), the microwaves enter at port 101, typically fundamental-mode circular waveguide (unfilled, gas or vacuum), though "port" here simply refers to the mmw input surface for simulation purposes. The port here may be a plane that cuts through a tapered waveguide transition.

The microwaves then proceed through a tapered reducer 102, connected to a first opening 104 in a wall of a tune cavity 105, usually cylindrical and substantially unfilled.

The reducer 102 is alternatively referred to as transition_3, a portion of which may include a match plug core 103 of "low-dielectric material", defined herein as a material with $\in_r < 4$ and conductivity $\sigma < 0.03$ S/m at the mmw frequency. Examples include teflon, polypropylene, and quartz-fiber-filled teflon. The first opening 104 is alternatively referred to as the tune cavity iris.

The effective volume of tune cavity 105 is adjustable, such as by adjusting a metallic piston 106 that fits closely inside the metallic cylindrical surface of the tune cavity, thereby changing the internal length of the cavity. Alternatively, a small metallic or dielectric rod extending into the cavity could be adjusted, as shown in a subsequent figure.

A second opening Coupling Port 108 in tune cavity 105 feeds microwaves into waveguide transition_2 109, normally though not necessarily circular, unfilled, and not tapered.

Preferably, a second adjustment mechanism such as second piston 107 at the second end of tune cavity 105 is also included so that the effective locations of the tune cavity fields to iris 104 and coupling port 108 can further be adjusted. In general, two degrees of freedom are both necessary and sufficient to achieve low S11 at port 101 for any combination of conditions presented by the rest of the DNP cavity system, though a single adjustment works surprisingly well in many cases when the rest of the parameters are properly optimized.

The microwaves proceed from transition_2 109 into tapered waveguide transition_1, which is dielectric filled, at least near its smaller end. The dielectric cores 111, 112 and the bulk metal wall 110 are shown for transition_1, partially as a reminder that the wall thickness is not infinitesimal and that there must be sufficient clearance between the outside diameter (OD) of this transition wall and the NMR rf coil 120 to avoid high voltage breakdown.

(We note that standing waves are present everywhere, and at extremely high amplitudes at the small end of transition_1, so it is not strictly proper to speak of "microwaves proceeding", when in fact they are going in both directions simultaneously. "The microwave power flows" would be more correct.)

The smaller end of transition_1 has a low-loss high-dielectric conical-section core 112, usually with Er greater than 9 and with conductivity less than 0.1 S/m, such as sapphire or 99.8% full-density alumina, so that its minimum diameter can be small compared to the sample cavity radius. However, quartz ($\in_r$=4.1) will also work well in larger cavities.

Adjacent to core 112 and possibly extending to the large end of the taper is a conical-section core 111 of a material of lower permittivity and low loss, such as quartz (if sapphire or alumina is used for the high-dielectric core), polypropylene, or Teflon.

The microwaves then proceed from the tip of the high-dielectric core of transition_1 through an opening, sample iris 113, in the reflective cylindrical wall 114 which lines the inside of the ceramic coilform 115 into the highly overmoded complex cylindrical sample cavity 116. The sample cavity includes a quartz sample tube 117 and dielectric plugs 118 with metallized end surfaces, along with the sample and sample trays.

The reflective wall 117 is substantially reflective to electromagnetic radiation at the EPR frequency $f_e$ but substantially transparent to the electromagnetic radiation at the highest NMR frequency of interest $f_N$, which would usually be $f_H$. This is most effectively achieved by using double-clad laminate with overlapping foil patches, similar to what is commonly seen in MRI coils for reflective and transparent frequencies (rf and gradients) each lower by three to five orders of magnitude. Low-loss copper-clad laminates with overlapping patches (perhaps eight azimuthal segments and several axially, with appropriate overlap) will work well. For example, preferred material is a liquid crystal polymer (LCP) laminate by Rogers under the trade name ULTRA-LAM 3850 (microwave $\in_r$=2.9, and dissipation factor ~0.002). It is readily available in substrate thicknesses of 0.025-0.1 mm with 0.018 mm copper claddings. The above components, their function, and other options will become clearer from subsequent figures and discussions.

The coupling between the sample cavity and the tuning cavity (determined mostly by the dimensions of the sample-cavity iris, transition_1, and transition_2) is such that there is sufficient field energy in the tuning cavity for the needed tuning and matching adjustability, but not so much as to lead to excessive losses in the hardware external to the sample cavity.

Figure 2:
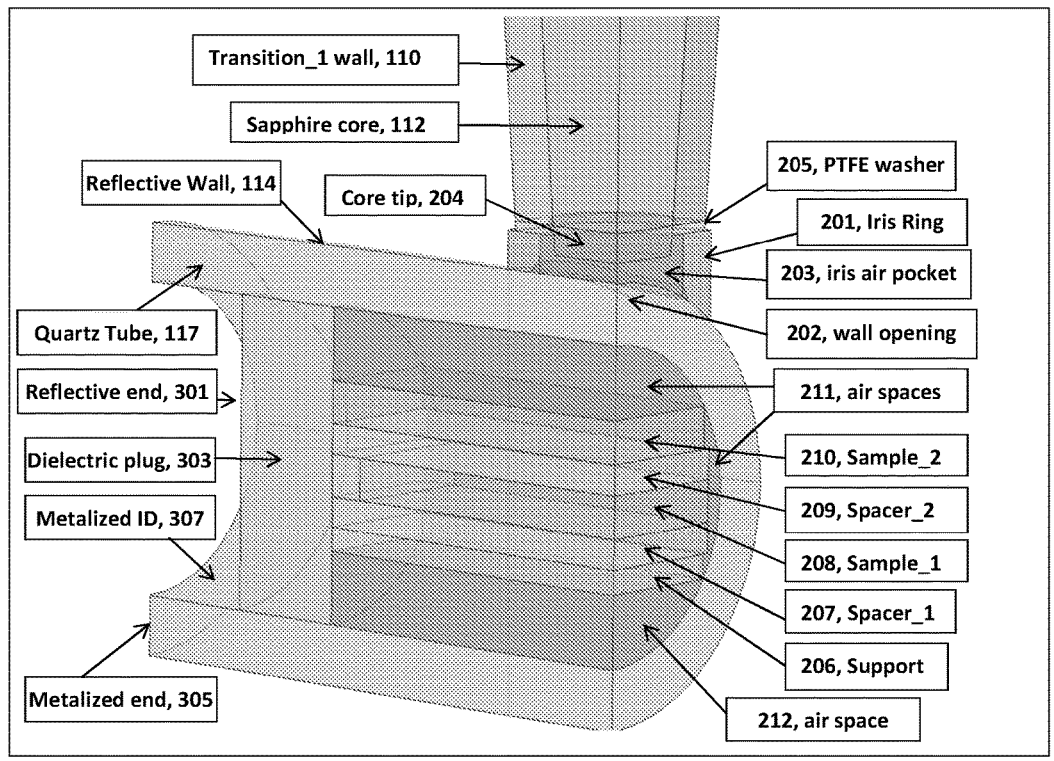
FIG. 2 is a perspective enlarged view of the (+x, +y) quadrant of a sample cavity with surface rendering and transparency for a particular case as simulated.

FIG. 2 depicts a perspective enlarged view of the (+x, +y) quadrant of the sample cavity with surface rendering and transparency for a particular case as simulated, from which the complexity of a typical sample cavity arrangement can begin to be appreciated. As will be seen in subsequent simulation results, the sample cavity (defined by its reflective boundaries) contains a number of electrically large dielectric components (samples, spacers, sample tube, air cavities of irregular shape), all of which independently support numerous modes near the $f_e$ frequency and all of which couple to other modes.

The tunable DNP cavity invention is based on the discovery that with suitable optimization of key components, it becomes possible to efficiently and easily adjust the coupled system for an extremely wide range of sample sizes and properties so that:
(1) S11 at the input port 101 is small (in principle, zero),
(2) leakage radiation is negligible,
(3) surface and volume losses external to the sample itself are minor, and
(4) the ratio of $B_{1S}/E$ within the sample is large compared to what is typically seen in large isotropic overmoded resonators.

The above are necessary requirements for maximizing DNP FOM.

The NMR rf coil and the ceramic coilform are not shown in FIG. 2, as they are irrelevant to the mmw fields and simulations. The cylindrical reflective wall 114 here is shown as being precisely on the outside of the quartz sample tube 117 and of zero thickness. In practice, the reflective wall 114 is affixed to the ID of the ceramic coilform 115, and there is a very small radial air gap between the reflective wall and the quartz tube—so that the sample tube can easily be inserted and removed. That air gap will typically be $\sim\lambda_0/40$, where $\lambda_0$ is the free-space wavelength at $f_e$. (The effect of that air gap was included in the simulations by reducing Er of the quartz tube by ~5%.) The thickness of the laminate reflective wall will typically be $\sim\lambda_0/20$. For reference, the thickness of the sample tube wall (usually quartz) will typically be between $\lambda_0/4$ and $\lambda_0$.

In the embodiment shown here, the sapphire core 112 of transition_1 is seen extending a short distance beyond the end of the metal wall 110 of transition_1. A metal iris ring 201 has been soldered to a copper patch on the reflective wall 114 around the reflective wall opening 202, leaving a small iris air pocket 203 into which the core tip 204 of the high-dielectric core 112 extends. Having an air gap here allows practical manufacturing tolerances on these parts. The effects of variations in the thickness of the air gap on tuning and matching are within the range of the tuning adjustments.

For real-world manufacturing reasons, it may not be easy for the conductive walls to be continuous from transition_1 to the sample cavity (these are separate parts), but it is still critical that mmw radiation escaping from the iris region (where the fields are most intense) be minimal. Since the triple-tuned solenoid 120 cannot easily be balanced at any frequency, the E fields at the NMR-frequencies in the $Si_3N_4$ coilform 115 near the iris can be relatively high. If the grounded conductive wall 110 of transition_1 makes point contact with the ceramic cylindrical coilform 115 rf noise may be generated during high-power decoupling. This can be avoided by having a low-dielectric washer 205, preferably PTFE, between the end of the wall of transition_1 and the iris ring 201. The mmw radiation escaping through the teflon washer into the $Si_3N_4$ coilform is minimal if the teflon washer is sufficiently thin.

Again, for further clarification, the minute air gap that in practice is required between the reflective wall 114 and the OD of the sample tube 117 is not shown in the figures and it is sufficiently thin that it need not be included in the simulations.

The concentrated microwaves proceed from the core tip 204 through the air pocket 203 through a wall opening 202 in the copper cladding of the reflective wall 114 and into the walls of the sample tube 117, which often would be of quartz. This wall opening would normally correspond to a round or oval region on the laminate where the copper has been etched from both sides so microwaves can proceed through the substrate into the sample tube. The laminate substrate could also be cut out in this region if desired.

Figure 3:
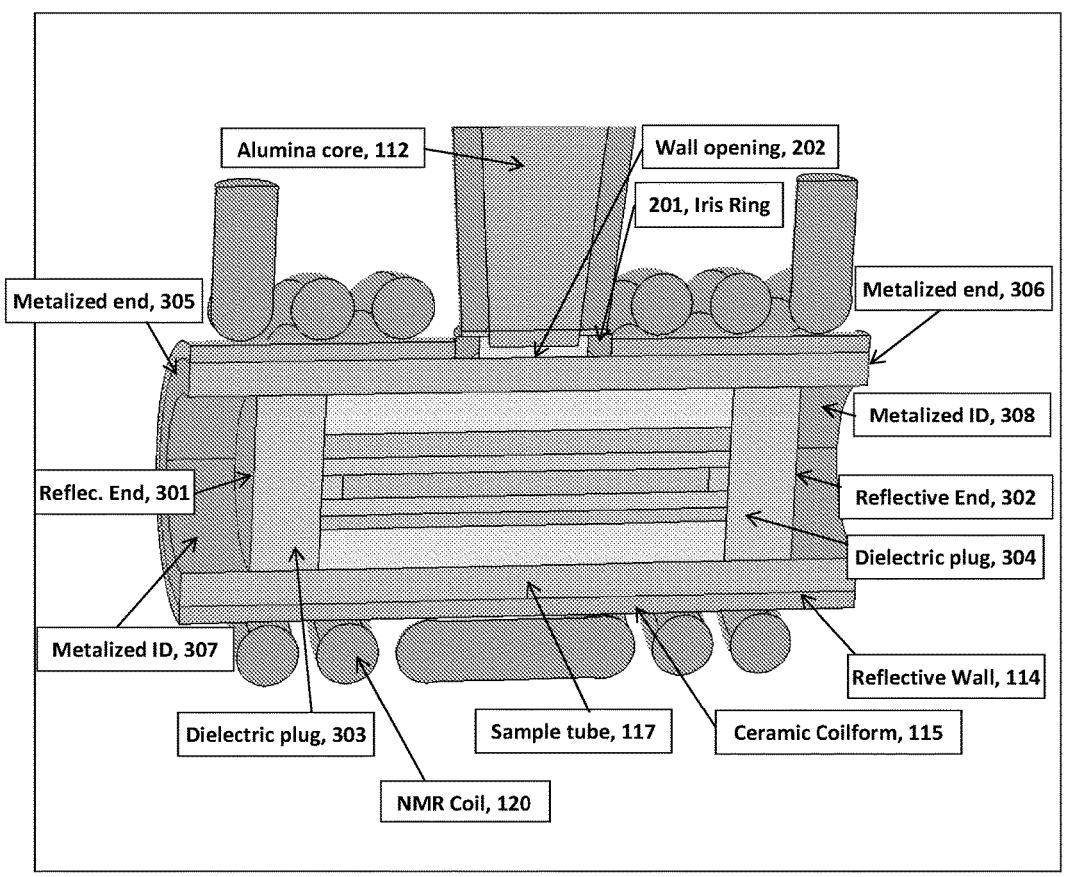
FIG. 3 is a perspective view of the +x semi-space with surface rendering highlighting cavity boundaries.

The sample cavity boundaries are better understood by turning to FIG. 3, which depicts another perspective view for the +x semi-space of the sample cavity with surface rendering and the sample cavity boundaries more visible. Material types are mostly distinguished by color. The sample cavity 116 is defined by its reflective external boundaries, which include the reflective wall 114 and additional metalized surfaces. A portion of the ends of the sample cavity is provided by reflective end surfaces 301, 302 on the external end of dielectric plugs 303, 304.

The quartz sample tube 117 has metalized ends 305, 306 and a metalized ID surface 307, 308 near its ends for a length sufficient to at least meet the plug reflective end surfaces 301, 302 so as to close the sample cavity. The quartz tube could also be metalized on its OD near the ends to insure there is minimal leakage past the tube end OD edges.

Typically, the metallization thickness should be greater than 1.5 times the skin depth at $f_e$ but less than a fifth the skin depth at $f_H$ at the typical operating temperature. The skin depth at 80 K at 300 MHz in aluminum coatings with typical defects, for example, is ~2 μm. Polymer films such as PET are commonly metalized with about 0.5 μm of aluminum, usually to reduce gas permeability. Such could be used for any of the reflective surfaces in the Doty cavity, though there may be better options.

Various alloys can have higher resistivity, better durability, sufficiently low magnetism, and much lower temperature dependence of resistivity compared to pure Al, Ag, Cu, Au, Pd, Pt, etc. Such alloys could be made by deposition of silver (for example by vapor or precipitation methods) followed by electro-deposition of some combination of Au, Cu, Ni, Mn, Pd, and Cr, followed by diffusion alloying in vacuum at 600-800 K. The mean alloy should have resistivity in the range of 4-50 μΩcm, with low temperature dependence over the full range of 4-700 K. For a resistivity of 6 μΩcm, for example (as assumed for the sample cavity boundaries in the COMSOL simulations at 200 GHz), the skin depth at 300 MHz is 7.5 μm, so a total alloy thickness of 0.5-0.7 μm should provide sufficient reflectivity at 200 GHz with little degradation in rf performance at 300 MHz.

The reflective ends 301, 302 could be of laminate construct similar to that preferred for reflective wall 114, as such a laminate selective reflector can provide much better transparency at $f_H$ and perhaps better reflectivity at $f_e$. It may also be possible to use a laminate selective reflector rather than metallization for surfaces 305-308, but metallization may be more practical here. An alloy metallization could also work in place of the selective laminate for the reflective wall 114 on the ID of the coilform 115.

As in FIG. 1, the ceramic (usually $Si_3N_4$) cylindrical coilform 115 and an NMR rf coil 120 are included in FIG. 3. Again, the rf coil is a 5-turn solenoid, and the solenoid leads are included here. In most cases, the rf coil would be a solenoid of 3, 5, or 7 turns, but other types of coils are also possible. Of course, the requirement of MW feed through opening 202 requires more space between the central turns of the coil than would be desired purely from an NMR coil optimization perspective, but that is a very minor tradeoff.

Some details can be better seen by returning now to FIG. 2. The concentrated microwaves feeding through the wall opening 202 excite modes in the quartz tube, which strongly couple to and excite modes in all the other dielectric components inside the sample cavity boundaries, the mmw fields of which can only be determined by numerical simulation methods. The particular sample/spacer arrangement illustrated here proved advantageous at 200 GHz for small solid samples (up to ~10 µL) of moderate permittivity ($\in_r$ ~7) for a sample tube OD of 3.5 mm.

Dielectric plug 303 establishes one end of the sample space inside quartz tube 117. A thin quartz plate 206 resting on the inside of the quartz tube 117 may be useful in providing reproducible mechanical support of the sheets above it. Low-dielectric spacer_1 207 supports sample_1 208. Low-dielectric spacer_2 209 lies on sample_1 and supports sample_2 210. There are irregularly shaped air spaces 211 above and beside the samples and air space 212 below the support plate 206.

A similar arrangement would often be optimum up to 1000 GHz, though with all dimensions reduced. Quartz tubes at least up to 7 mm work well at least up to 200 GHz, where $\lambda_0$ is 1.5 mm. Better options for working with liquid samples are shown later.

Figure 4:
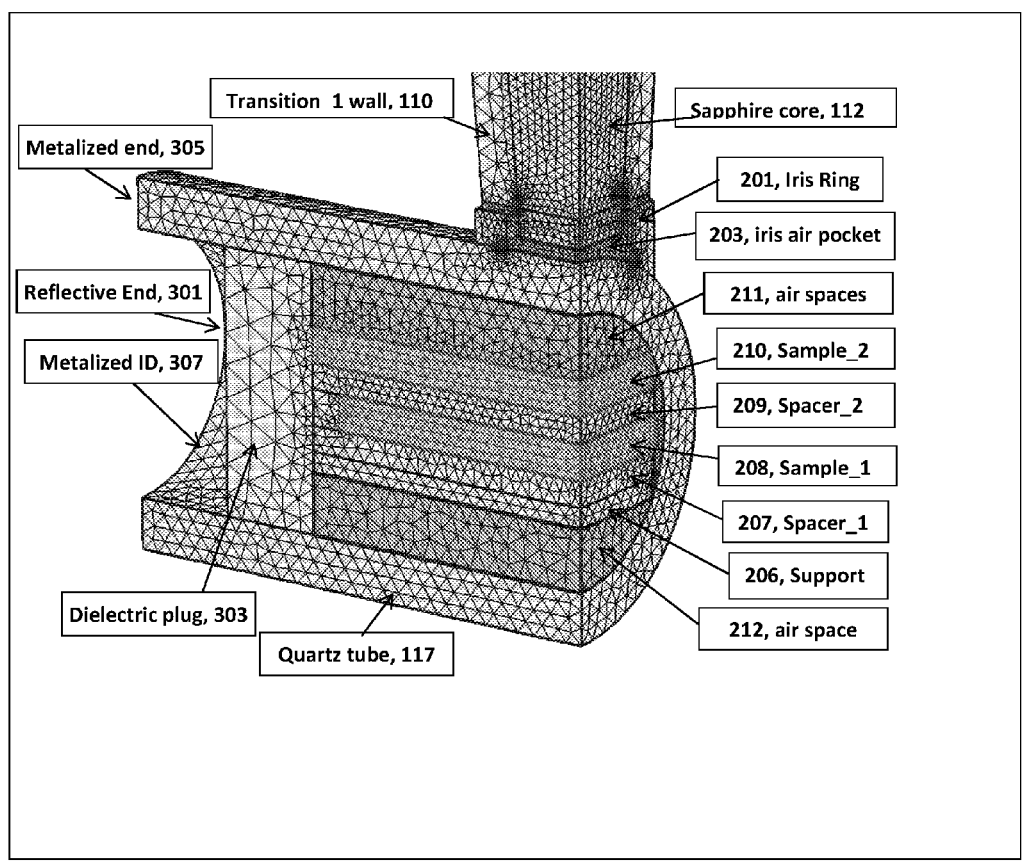
FIG. 4 shows the mesh for the (+x, +y) quadrant for a typical simulation.

A highly parameterized model was set up in COMSOL to make it possible to efficiently explore a wide range of cavities and conditions using an extensive parameter space (~90 geometric, electrical, sample, and meshing control parameters). The conducting surfaces of the domains were simulated with impedance boundary conditions realistic for typical surfaces at 200 GHz, and appropriate losses were assigned to all dielectrics. The mesh was optimized in each domain separately, and solver parameters were optimized to minimize time to convergence. When the tune cavity was symmetric (no offset in the y direction), two symmetry planes could be used to dramatically reduce computation time. The mesh for the (+x, +y) quadrant for a typical optimized case in shown in FIG. 4 with the samples in red and the air spaces in blue.

Hundreds of cases were run for a wide range of sample sizes and properties ($\in_r$ from 3 to 8, $\sigma_s$ from 0.1 to 1 S/m), adjusting the various parameters to maximize FOM at low S11 and to find cavity parameters that would be fixed during manufacturing of the probe head (iris size, transition tapers and lengths, tune cavity diameter, sample cavity length, etc.) that permitted high FOM over a wide range of sample conditions when the tune cavity was adjusted to minimize S11. One of the more important parameters is core tip diameter, which can be made smaller by using material of higher dielectric constant for the core 112 and by increasing its taper angle. For the parameters explored, the optimum tip radius was always greater than $\lambda_0/3$, which is much larger than expected from theory and experience with classical cylindrical cavities as used in EPR.

S11 below −7 dB is sufficient in the simulations, though experimentally S11 below −20 dB should generally be easy to achieve—and, with sufficient effort, possible in the simulations. Obviously, everything inside the sample cavity can easily be changed as needed (they are expendables) to accommodate different samples.

In some cases, the FOM could vary by two orders of magnitude for a given sample (volume and properties) as spacer thicknesses and permittivity were changed, even with the tune cavity adjusted for low S11. In some cases, with a particular sample and set of spacers and dielectric plugs, FOM could vary by an order of magnitude as the tune cavity was adjusted from a poorly matched to a well matched condition. Clearly, different spacers and dielectric plugs are required for different samples to achieve optimum FOM (cavity tunability is not sufficient). However, some conditions of samples and spacers were much more tolerant of mistuning.

Numerous experimental validations of the COMSOL software were carried out on various overmoded components, with some dimensions more than $20\lambda_0$, and in all cases excellent agreement was seen between the simulations and the experiments. Analytical solutions (mode frequencies and Qs) are well known for classical cylindrical cavities. The COMSOL software and simulation methodology were validated by simulating simple cylindrical cavities up to TM444 and TE444, fed by a Doty cavity coupler—the mildly overmoded tapered transition_1 feeding an iris, as disclosed herein. Mode frequencies always agreed with the analytical solutions within a minor fraction of a percent. The high-mode simulated Qs (which in some cases exceeded 12,000) were generally ~30% below the values from the classical analytical solutions, where there is at least that much uncertainty, owing to various factors not considered in the classical derivations of high-frequency small-scale surface resistance.

Figure 5:
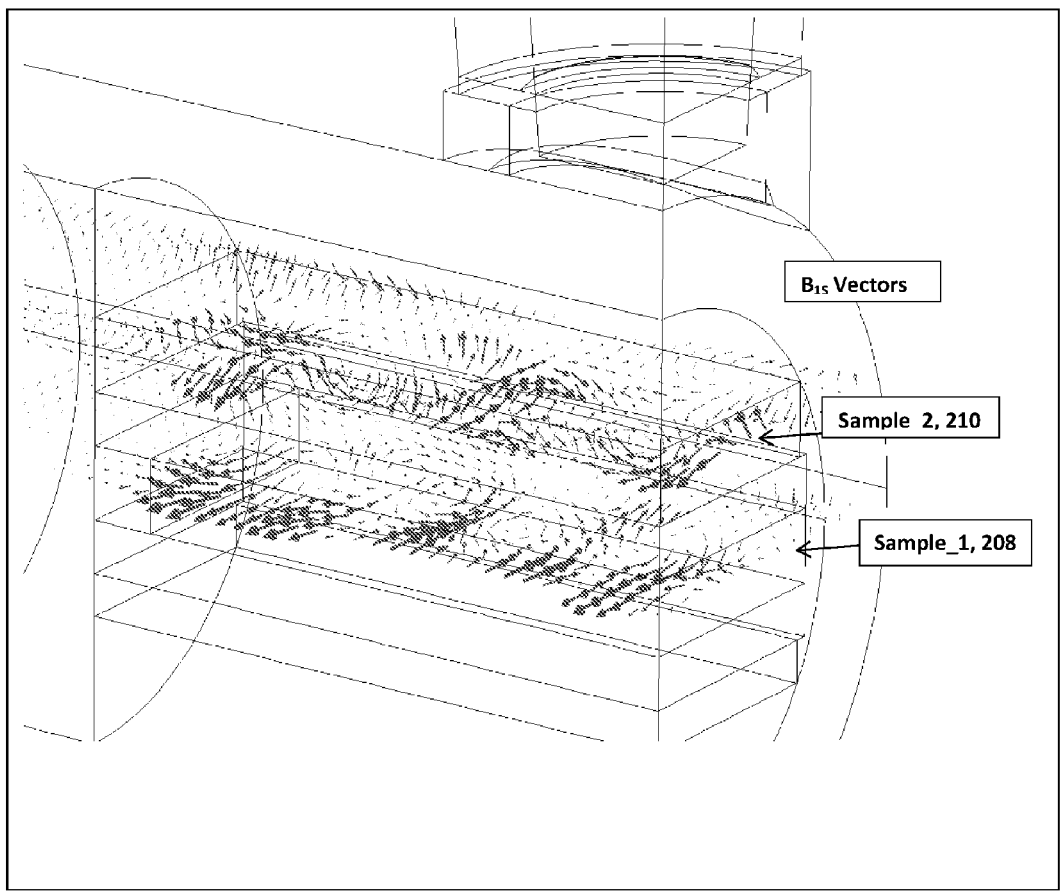
FIG. 5 depicts the mmw B vectors in the planes through the two sample sheets for the particular case described in Table 1.

FIG. 5 depicts the mmw B vectors in the planes through the two sample sheets for a particular case. Note that the B vectors are predominately transverse within the sample sheets, as desired for high FOM when the axis of the cavity is transverse to $B_0$. The arrow lengths are proportional to B magnitude. (Note that the B displayed is that actually calculated by COMSOL. The EPR rotating component, which is used in the calculation of $\eta_f$ and FOM, is half of that.) The maximum value of $B_{1S}$ (the transverse rotating component of the linear field) within the sample for 1 W input to the full input port (0.25 W to the quadrant in the simulation) was 252 µT. Additional relevant parameters and results are listed in Table 1. Under some conditions with larger cavities than this example, the FOM of Doty cavities may approach two orders of magnitude more than reported by Nanni et al [9, 10], and perhaps up to four orders of magnitude larger than achieved by Prisner's group [11, 12].

Figure 6:
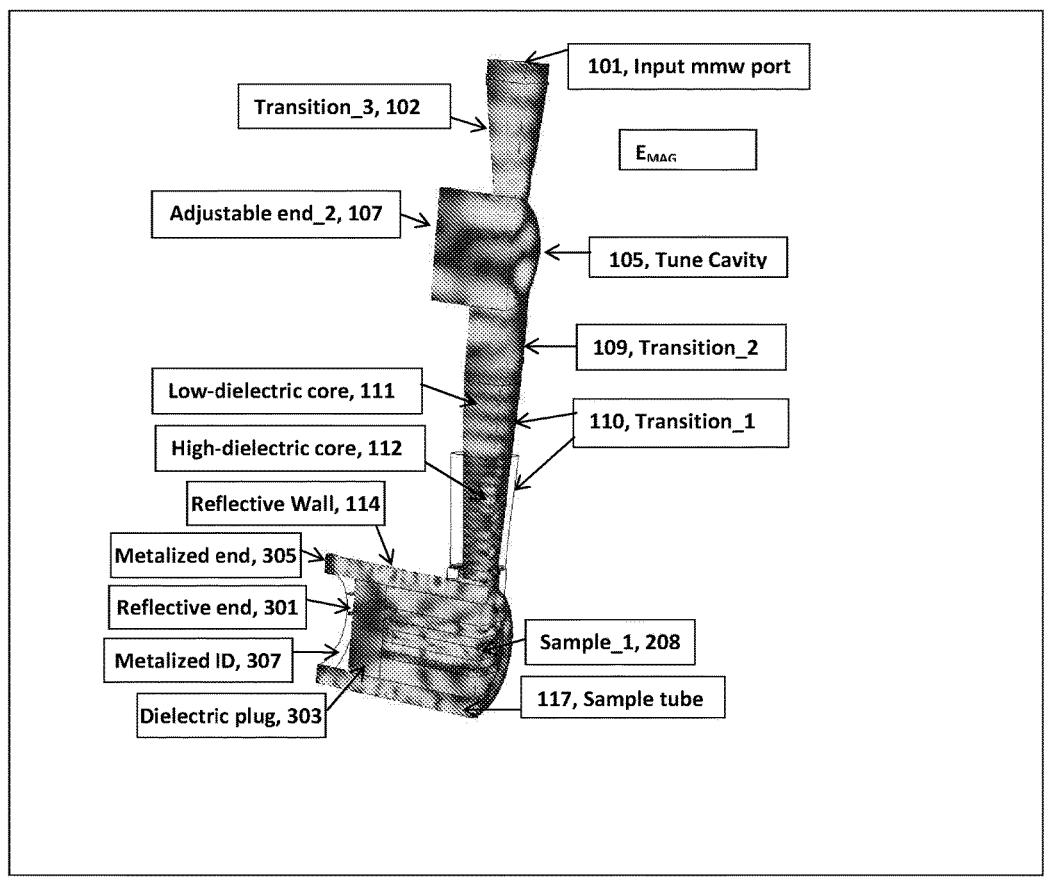
FIG. 6 is a surface plot of the magnitude of E on the x=0 and y=0 planes, where blue representing minimum and red represents maximum magnitude, for the same case as FIG. 5 and Table 1.

FIG. 6 is a surface plot of the magnitude of E on the x=0 and y=0 planes of the full simulation space for the same case as FIG. 5 and Table 1. Maximum magnitude is shown in dark red, and minimum in deep blue. Note that the E fields are higher in the spacers and in the quartz tube than in the sample sheets. Also note that (A) the match plug core 103 was not included in this case, (B) the low-dielectric core 111 extends to the large end of assembly 110, transition_1, and (C) its bulk metal wall (which is irrelevant to the simulation when the mmw domain boundaries are properly defined) is shown extending only to the plane of the boundary between cores 111 and 112. The solid metal parts included in this simulation (the iris ring 201 and the walls of 110) are shown unfilled, as there is no electric field inside them. (The edges of some of the domains appear a little ragged because regions of near zero E field were not displayed.) Note that core 111 is optional, and if present it may extend only part way to 109, transition_2.

The mode structure in everything is complex, high-order, variable, and generally not germane to the objectives of high DNP FOM, low S11 at the input port 101, and high NMR S/N, usually at several different frequencies. The presence of standing waves near the input port indicates S11 was not zero. In this case, S11 was −7.5 dB, and that was sufficiently low for high performance and good accuracy in the simulations. Much higher standing waves are seen elsewhere. They are either unavoidable, unimportant, or necessary, as in the tune cavity 105, where it is necessary to have sufficient stored energy to facilitate tuning and matching of the sample cavity over a wide range of sample conditions.

Figure 7:
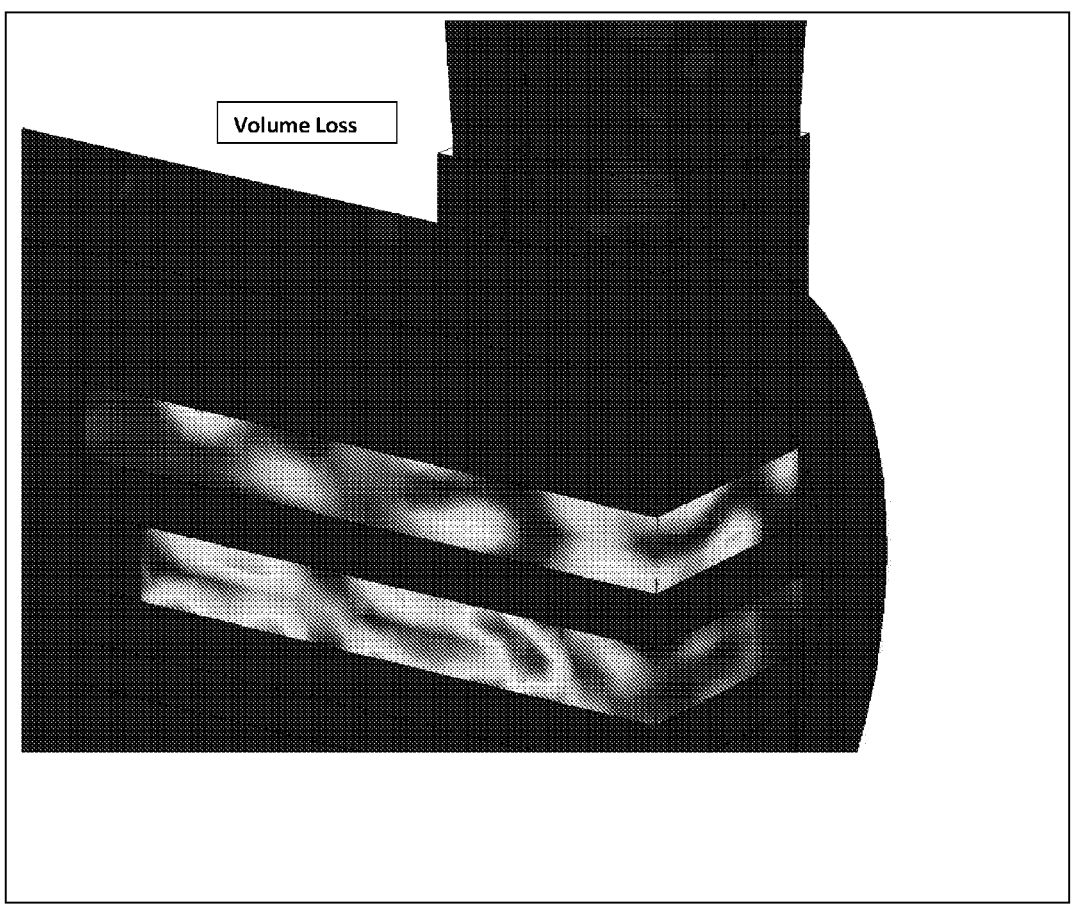
FIG. 7 is a surface plot of volume loss in MW/m³ on two orthogonal planes.

FIG. 7 is a surface plot of volume loss in $MW/m^3$ (or $mW/mm^3$), again on two orthogonal planes. Again, deep blue represents zero and dark red is maximum, which in this case was about 300 MW/m³. Clearly, the loss density is much higher within the sample, which here has $\sigma_s$=0.2 S/m, equivalent to a loss tangent of ~0.003 at 200 GHz for $\in_r$=7. The loss tangents of the other dielectrics were an much smaller. Still, losses outside the sample (surface, volume, leakage radiation, and S11) are dominant for this sample. The sample losses in this case are about 36% of the total losses. Thinner sample sheets may give higher FOM in cases where $\sigma_s$ is larger.

Figure 8:
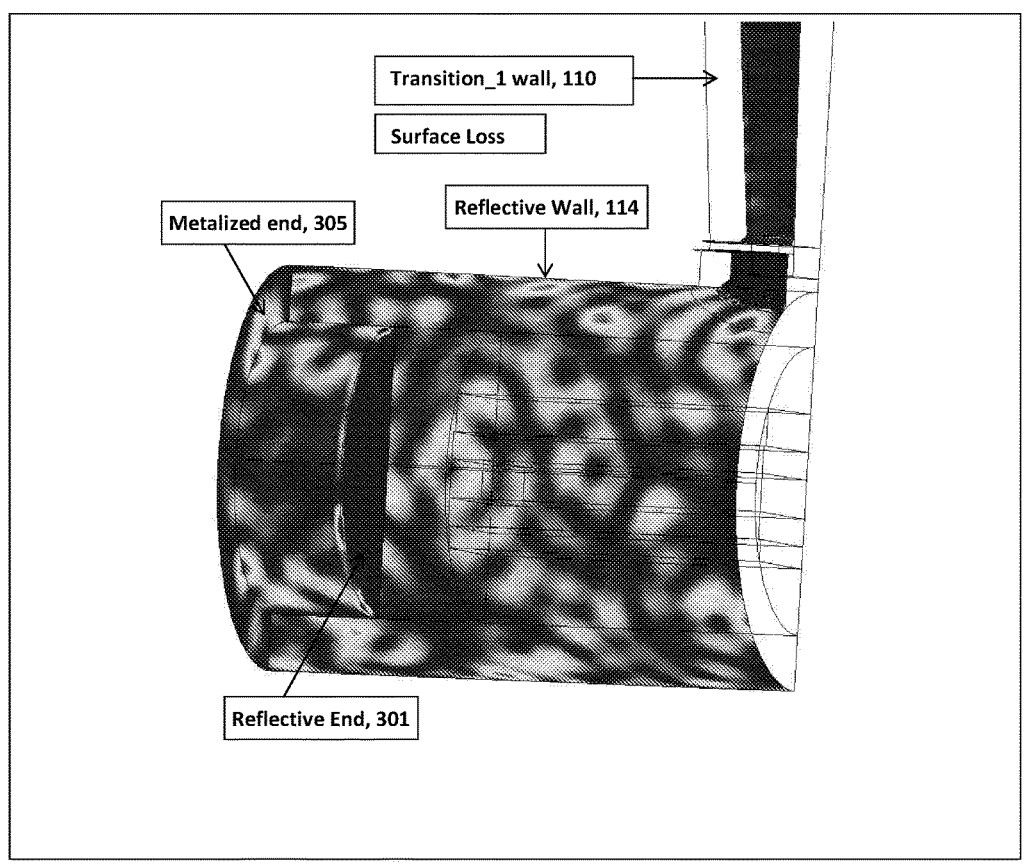
FIG. 8 is a surface plot of surface loss in W/m² on two orthogonal planes.

FIG. 8 is a surface plot of surface loss in W/m² (or μW/mm²), again on two orthogonal planes. The surfaces for all the waveguides and transitions had been assigned bulk conductivity σ=2E-7 S/m, and the sample cavity boundaries (whether metallization or laminate) were assigned σ=1.5E-7 S/m. Again, deep blue represents zero and dark red is maximum, which in this case (with the exception of a few very small spots) was about 5 kW/m².

Figure 9:
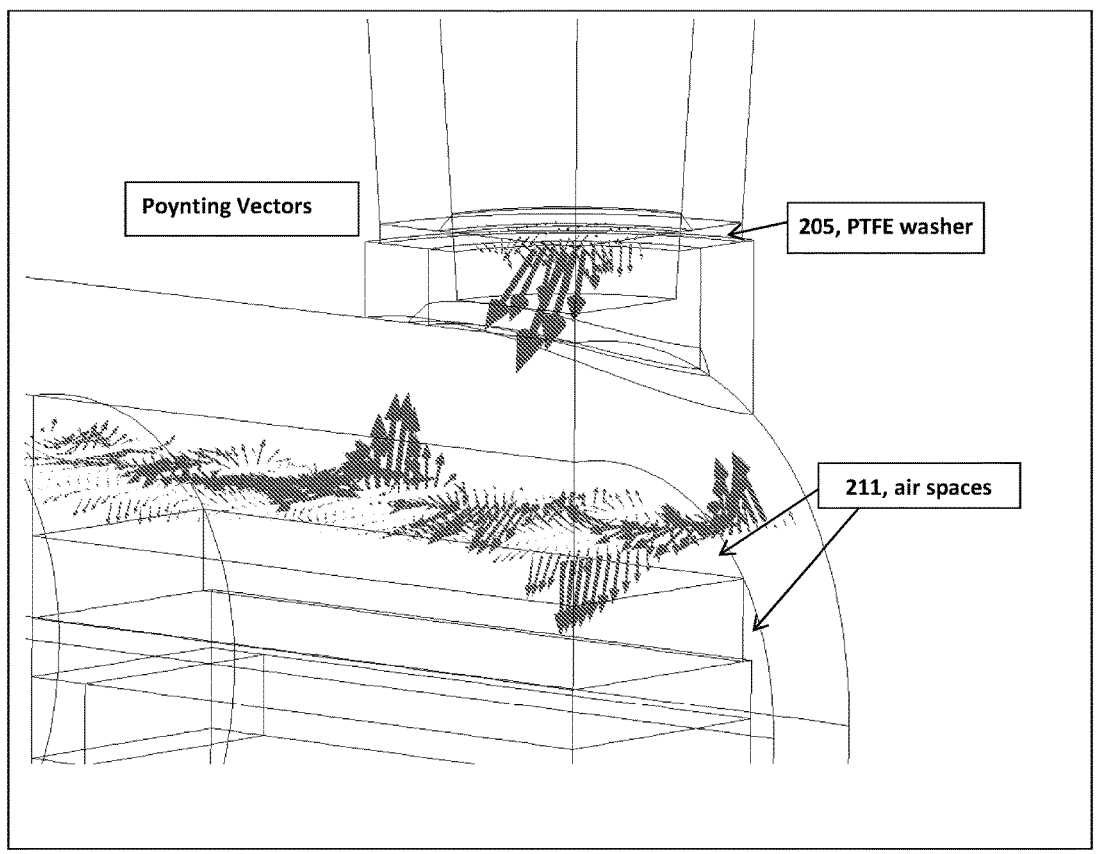
FIG. 9 shows Poynting vectors on two parallel planes in the cavity.

FIG. 9 shows Poynting vectors in the plane of the dielectric washer 205 and in the air space just above sample_2. This plot confirms that leakage through the PTFE washer is small. It also shows that it is not productive to attempt to think in terms of microwave beams or directions within a complex cavity.

The NMR Performance. There is no need to say much about the rf side of the DNP cavities, disclosed in the previous Figures, as it is obvious that the rf performance without DNP can approach (within a factor of three) what is seen in conventional NMR probes, and that can be orders of magnitude better than seen in some prior DNP probes, such as those by Prisner [11, 12], and probably those by Feintuch [13], Habara [14], and Annino [19]. The Doty cavity achieves such an rf advantage because a solenoid of optimum inductance (20-100 nH) can be used with only about a factor of four loss in filling factor and no significant loss in Q—because selective reflective walls (similar to those that have been in wide use in MRI for decades) can readily be implemented. For larger cavities, two-coil arrangements according to the prior art would be better [21, 22, 23].

Calculations indicated the DNP S/N on the low-frequency or mid-frequency channels of an H/X/Y probe head utilizing the Doty DNP tunable cavity could be three orders of magnitude larger than would be likely from one based on the cavities of Prisner et al.

There is also no need to say much about B₀ homogeneity, as that subject has been well addressed in many prior publications and patents [27-29]. The largest unshimmable B₀ field inhomogeneities in the example shown in FIGS. 2-9 are near the edges of the samples. Various well-known measures may be taken to reduce those inhomogeneities, and some of those measures would not significantly degrade DNP FOM. For example, appropriately shaped pieces of teflon or polypropylene could be used to fill the air spaces 211, 212. Solid Teflon or other low-loss dielectric could be used for the dielectric plugs 302, 303 rather than foamed Teflon. Other measures are also obvious from the prior art. The solid dielectric core 112 may be one of the more difficult parts to magnetically compensate, though it could be adequately compensated by placing an aluminum conical sleeve over the wall of 110, transition_1. Another option would be to plate the ID and OD of this waveguide wall and the iris ring with the appropriate amounts of palladium, according to the prior art for NMR coils, followed with several skin depths of silver or gold. The solenoid, described earlier as copper, would preferably have an aluminum core, according to the prior art.

Of course, maximizing FOM, S/N, spectral resolution, and sample handling convenience are not the only considerations when samples are extremely expensive and limited. For optimum performance in very small samples, the Doty DNP cavity can be made smaller. However, it may have few advantages relative to prior art when the sample cavity diameter is less than $2\lambda_0/3$ or when its length is less than $2\lambda_0$.

Figure 10:
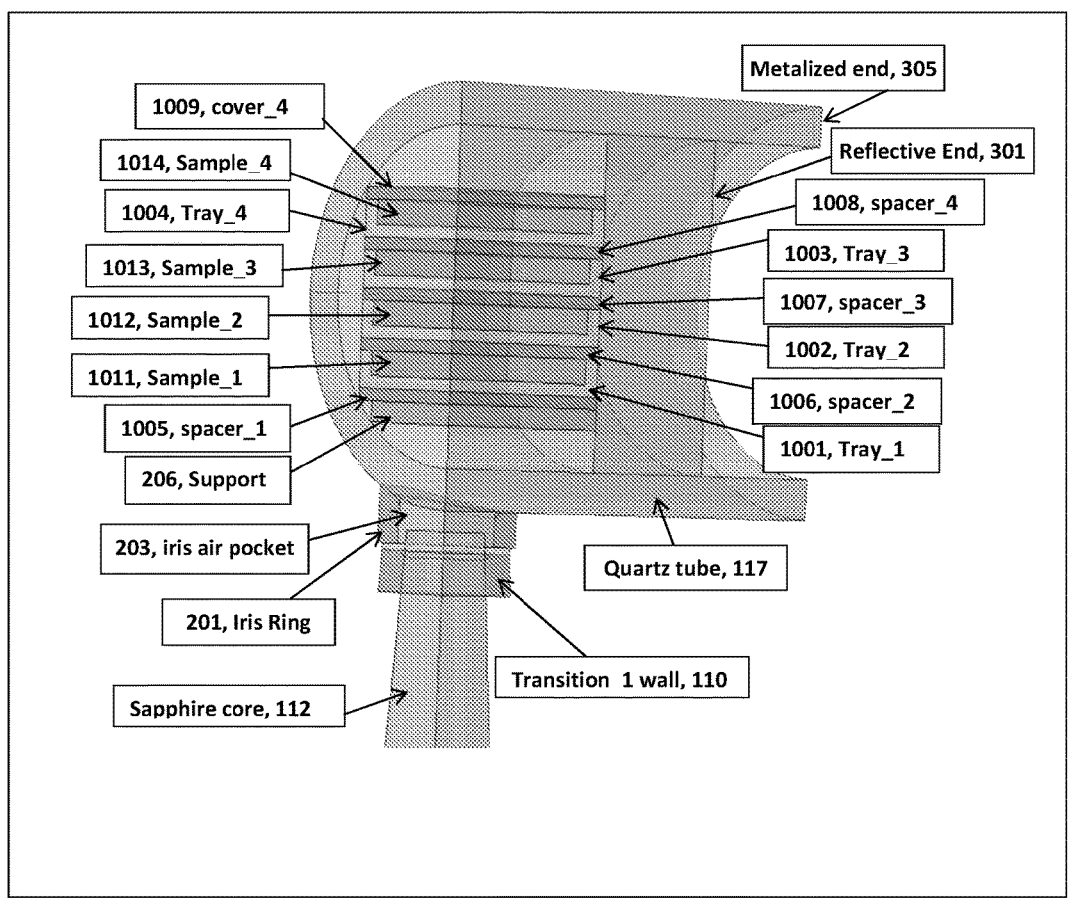
FIG. 10 is an enlarged view of a quadrant with surface rendering and transparency of a sample cavity with sample trays containing liquid samples, and microwaves entering from the bottom.

Larger and Liquid Samples. For direct detection of nuclides of low sensitivity, such as natural abundance ¹⁵N, in H/X/Y/e⁻ probes, it may be beneficial to utilize even larger sample volumes. In FIG. 10, the cavity diameter was increased from $2.4\lambda_0$ to $4.8\lambda_0$, and the cavity is displayed inverted relative to the earlier figures, as this is the more likely actual orientation (microwaves coming in from the base of the probe). Four small rectangular sample trays 1001, 1002, 1003, 1004 may be used to hold liquid samples. Thin wafers 1005, 1006, 1007, 1008, 1009 can be used to cover and space them. The trays and/or wafers preferably would be of material of relative permittivity less than 3.5, such as Teflon or low loss liquid crystal polymer, similar to the Rogers Ultralam 3850 substrate. Alternatively, the spacers could be Teflon-clad $Si_3N_4$ or sapphire to more effectively conduct heat from the unavoidable spots, as were seen in FIG. 7. Contrary to any prior art, the tunable DNP cavity permits the use of a stack of sample trays with lateral dimensions greater than $\lambda_0/2$ and possibly even up to $20\lambda_0$. Preferably, the depth of the trays is less than $\lambda_0/2$.

A large cavity, with a total sample volume of 15 μL, was found to have FOM even higher than for the smaller cavity described in Table 1 in many cases.

Fine Tuning. Tunable shorts have been standard products by microwave companies since the 1940's. Examples may be found, for example, on the websites of companies such as Sage, Cernex, and Millitech, generally under waveguide passive products. In the typical case, a shaft is adjusted by a micrometer-type screw and thimble into the open space in a shorted section of a waveguide, more often rectangular than round, as rectangular waveguide is much more common. Appropriate precision measures are taken to insure there is little clearance for microwave leakage between the rotating shaft and the flange from which it protrudes into the waveguide or cavity. Micrometer mechanisms with shaft diameters down to ~0.8 mm are readily available for use in rectangular waveguide for use up to 170 GHz, and smaller sizes could easily be made. In the 3.5-mm Doty cavity example presented in Table 1, the tune cavity diameter was equal to $\lambda_0$, 1.5 mm. As noted in the earlier description of FIG. 1, the effective volume of the tune cavity could be adjusted by advancing a rod into the cavity.

Figure 11:
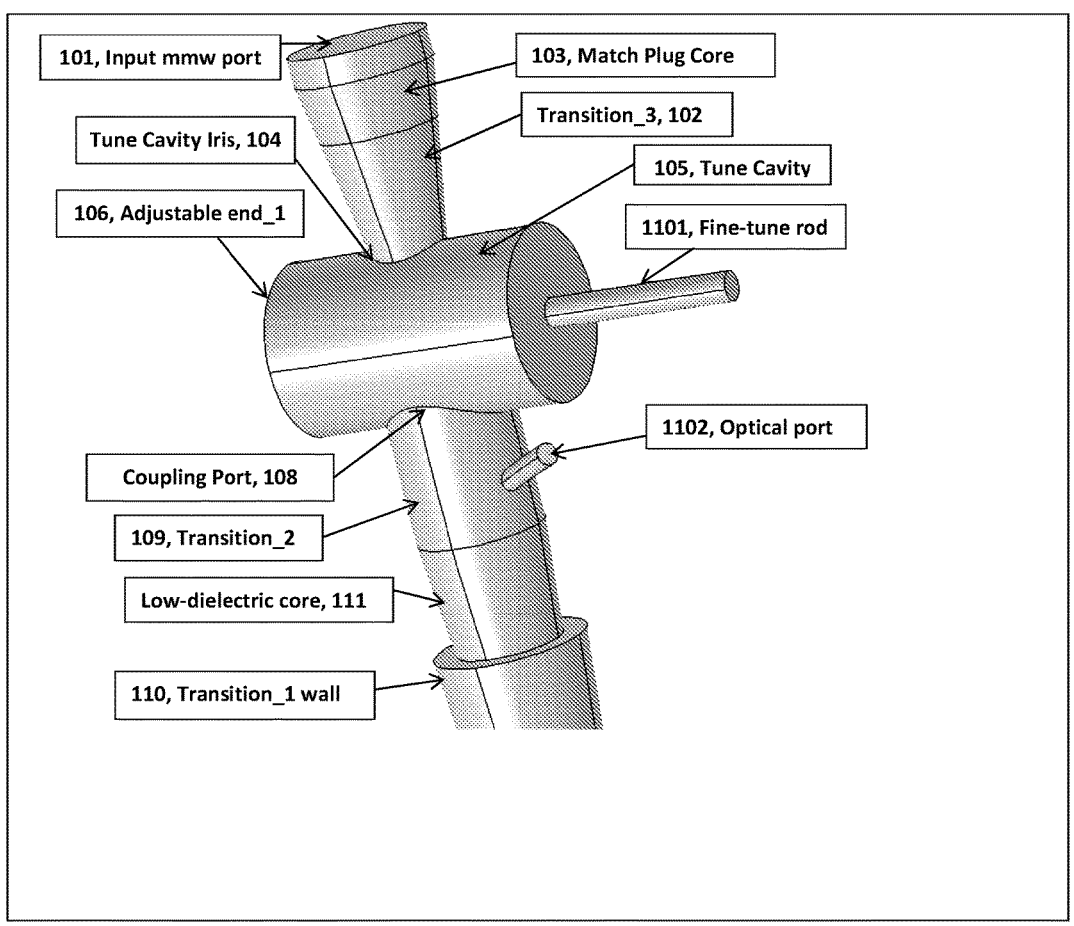
FIG. 11 depicts the addition of a fine-tune dielectric rod and a port for optical irradiation.

FIG. 11 illustrates the addition of a fine-tune adjustment rod and a port 1102 for optical irradiation. The rod 1101 could be metal or dielectric. In either case, the rod would be inside a metallic part (not shown, as usual) that establishes the conductive boundaries of the cavity and the rod. In the case of a dielectric rod of permittivity Er, the cutoff frequency of a circular waveguide with core of permittivity $\in_r$ should be greater than $f_e$. For example, for a sapphire fine-tune rod 1101, its diameter should be less than 0.6 mm at 200 GHz to prevent significant transmission out of the cavity through the rod.

Any off-the-shelf tunable-short mechanism with shaft diameter less than that chosen for the tune cavity could be mounted on one or both ends of the tune cavity to permit adjustment of both the volume and the effective centering of the tune cavity.

The Q calculated by COMSOL and shown in Table 1 is very high by DNP standards (and higher yet for larger cavities with low-loss samples). Sometimes the frequency difference between successive modes is small compared to the bandwidth of the Q of a particular mode, which can make it easier to achieve low S11. Choosing a small diameter for the adjustment rod 1102 also makes it easier to tune and match a high-Q cavity for low S11. The simulations also show that using a fine metal rod to adjust the effective volume and centering is much less likely lead to poor FOM1 at a low-S11 condition than using a sapphire rod.

It should be noted that although the Q is high, it is not too high to permit pulse EPR methods. Even for an under-coupled cavity Q of 1000 at 263 GHz, the ring-down time constant ($2Q/\omega$) is about 0.6 ns when matched, which is generally fast compared to other mechanisms at play.

Optical Irradiation. As noted by Annino et al [19] and others [30], optical irradiation by visible or UV light can be useful, particularly in samples with triplet states that can be optically excited, where it can enable hyperpolarization at room temperature without paramagnetic centers in the sample and without intense microwave irradiation.

With a few minor limitations on the Doty tunable DNP cavity design, optical irradiation can easily be added with no significant degradation in either DNP FOM or NMR performance. If optically transparent dielectrics are used for high-dielectric core 112 and low-dielectric core 111, such as sapphire and quartz respectively, and if at least most of the metal boundaries of the tunable DNP cavity are plated with metals of high reflectivity and high surface stability, such as Ir, Pt, Pd, Al, Ag, or Au, optical irradiation into transition_2 109 will efficiently get to the sample if wall opening 202 is not opaque to the optical radiation. If the reflective wall 114 is made from copper-clad Teflon, the thin Teflon should have sufficient optical transparency. If the reflective wall 114 is made from copper-clad LCP, it may be necessary to cut a hole in the substrate to provide a wall opening 202 that is sufficiently transparent to optical as well as the mmw radiation.

A particularly convenient way to add optical irradiation would be to add an optical irradiation port 1102 into transition_2. For effective optical irradiation of the samples, the spacers, trays, and covers—if present, as in FIG. 10—should have sufficient transparency. Suitable materials include sapphire, quartz, and some fluoroethylene polymers and copolymers. Light loss out the input port 101 can be reduced by using a thick Teflon match plug 103, as most of the light incident on it would be reflected.

Figure 12:
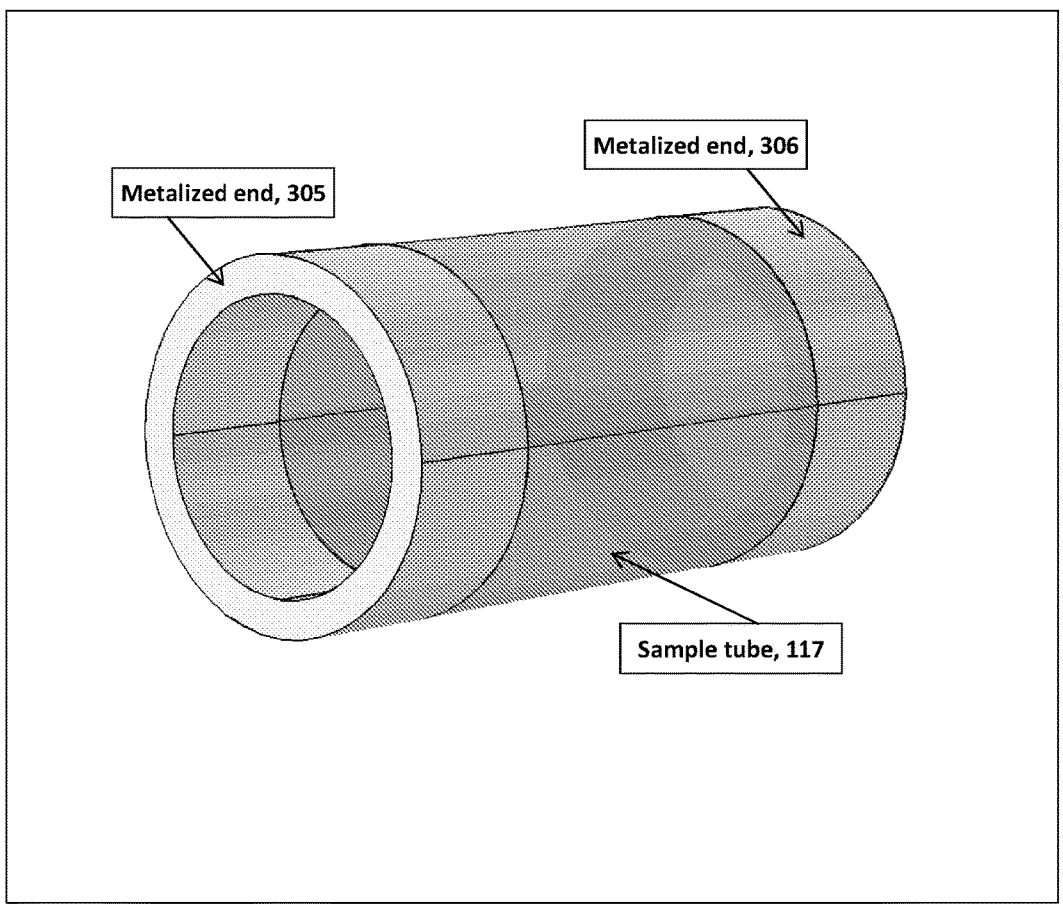
FIG. 12 depicts a typical sample tube according to an embodiment of the invention.

FIG. 12 depicts a typical sample tube 117, as seen in earlier figures, of outer radius r, length L, and wall w, with metallization covering its end surfaces and extending toward the center on at least one cylindrical surface, though usually on both the ID and the OD, a distance greater than w and less than L/3. The metallization thickness is normally greater than 0.1 micron and less than 2 microns, and the dielectric is normally quartz, silicon nitride, mullite, or aluminum oxide, either polycrystalline or single crystal.

Variations. Many of the details seen in the preceding figures could be changed in radical ways and still achieve major increases in FOM compared to the prior art and be within the scope of this invention as claimed. For example, transition_1 could feed the cavity without an iris ring or air pocket, the tune cavity need not be cylindrical, multiple tune cavities could be used, the number of spacer and sample plates could be increased or decreased, additional dielectric plugs could be added, and transition_3 and transition_2 need not be circular.

One can imagine other—possibly better—ways of providing reflective end surfaces to the sample cavity. The dielectric plugs 303, 304 could have reflective surfaces on all of their surfaces—possibly selective laminates. If the plugs are long enough to extent beyond the ends of the sample tube, metallization would then not be needed on the ID of the sample tube. If the plugs included a larger diameter lip and were pressed snuggly against the sample tube (as is common in plug caps for MAS rotors, as disclosed by Doty in U.S. Pat. No. 7,170,292, [26]), the lips could be metalized. It then would not be necessary to metalize the ends of the sample tube.

The best option for the sample tube would often be quartz, but other dielectrics, such as high-silicon mullite could be used in cases where sample conductivity is relatively high, as mullite is mechanically much more robust and the loss tangent of some mullites is adequate below 50° C. Alumina, sapphire, and $Si_3N_4$ could also be used. Silicon nitride is particularly attractive, as wall thickness can be less than half that of quartz tubes of similar mechanical robustness.

The sample cavity need not be oriented with its axis transverse to $B_0$. It may be possible to achieve better $B_0$ homogeneity (hence, spectral resolution) if the sample cavity axis were oriented at the magic angle, 55.7° with respect to $B_0$, though this would likely result in reduced DNP FOM and reduced NMR S/N, as the transverse components of the mmw and rf fields would be reduced. Operation at a small offset with respect to the magic angle may also be useful.

Even better spectral resolution would be possible if the sample could be spun at the magic angle, but that may require modifications to the sample cavity that are not obvious.

The coilform, sample cavity, sample tube, and dielectric plugs could even be of non-circular cross-section, such as oval or rectangular, in which case the reflective side walls would not by cylindrical, as generally described throughout this disclosure, and it would be characterized by a minimum transverse dimension rather than a cavity diameter. A non-cylindrical cavity is not likely to be preferred, as all the components inside the cavity reflective boundaries are a part of the resonant system and thus should be able to be reproduced with high precision reasonably easily. Also, it would be very difficult to utilize a non-circular waveguide for transition_1 because of the need for a precision-fitting core—so that the iris diameter can be small compared to the cavity radius.

REFERENCES

1. S C Howell, M R Mesleh, and S J Opella, "NMR structure determination of a membrane protein with two transmembrane helices in micelles." *Biochemistry* 44, 5196-5206, 2005.
2. C H Wu, A. Ramamoorthy, and S J Opella, "High-resolution heteronuclear dipolar solid-state NMR spectroscopy", J. Magn. Reson, Series A 109, 270-272, 1994. R M Marassi and S J Opella, "A solid state NMR index of helical membrane protein structure and topology," J. Magn. Reson., 144:150-155, 2000.
3. K J Glover, J A Whiles, G Wu, N-J Yu, R Deems, J O Struppe, R E Stark, E A Komives, R R Vold, "Structural evaluation of phospholipid bicelles for solution-state studies of membrane-associated biomolecules", Biophys. J. 81, 2163, 2001.
4. A A De Angelis, A A Nevzorov, S H Park, S C Howell, A A Mrse, S J Opella, "High-resolution NMR spectroscopy of membrane proteins in 'unflipped' bicelles", J. Am. Chem. Soc. 126, 15340, 2004.
5. Al Smirnov, O G Poluektov, "Substrate-supported lipid nanotube arrays", Journal of the American Chemical Society 125, 8434, 2003.
6. Chekmenev, E. Y.; Hu, J.; Gor'kov, P. L.; Brey, W. W.; Cross, T. A.; Ruuge, A.; Smirnov, A. I. $^{15}$N and $^{31}$P solid-state NMR study of transmembrane domain alignment of M2 protein of influenza A virus in hydrated cylindrical lipid bilayers confined to anodic aluminum oxide nanopores, J. Magn. Reson. 173 (2005), 322.
7. V Denysenkov, T Prisner, "Liquid state Dynamic Nuclear Polarization probe with Fabry-Perot resonator at 9.2 T", J. Magn. Reson., 217, 1-5, 2012.
8. P Neugebauer, J G Krummenacker, V P DDenysenkov, G Parigi, C Luchinat, and T F Prisner, "Liquid state DNP of water at 9.2 T: an experimental access to saturation", Phys. Chem. Chem. Phys. 15, 6049, 2013.
9. E A Nanni, A B Barnes, Y Matsuki, P P Woskov, B Corzilius, R G Griffin, and R J Temkin, "Microwave field distribution in a magic angle spinning dynamic nuclear polarization NMR probe", JMR 210, 16-23, 2011.
10. A B Barnes, M L Mak-Jurkauskas, Y Matsuki, V S Bajaj, P C A van der Wel, R DeRocher, J Bryant, J R Sirigiri, R J Temkin, J Lugtenburg, J Herzfeld, and R G Griffin, "Cryogenic sample exchange NMR probe for magic angle spinning dynamic nuclear polarization", JMR, doi:10.1016/j.jmr.2009.03.003.
11. V Denysenkov, T Prisner, "Liquid state Dynamic Nuclear Polarization probe with Fabry-Perot resonator at 9.2 T", J. Magn. Reson., 217, 1-5, 2012.
12. P Neugebauer, J G Krummenacker, V P DDenysenkov, G Parigi, C Luchinat, and T F Prisner, "Liquid state DNP of water at 9.2 T: an experimental access to saturation", Phys. Chem. Chem. Phys. 15, 6049, 2013.
13. A Feintuch, D Shimon Y Hovav, D Banerjee, I Kaminker, Y Lipkin, K Zibzener, B Espel, S Vega, D Goldfarb, "A Dynamic Nuclear Polarization spectrometer at 95 GHz/144 MHz with EPR and NMR excitation and detection capabilities", J. Magn. Reson., 209, 136-141, 2011.
14. H Habara and M Park, U.S. Pat. No. 7,292,035, "NMR.ESR Antennas and Spectrometers Using These", 324/316, November 2007.
15. S Han et al, USP Application Publication 2009/0121712, "Dynamic Nuclear Polarization Enhanced Nuclear Magnetic Resonance of Water Under Ambient Conditions", 324/307, 5/2009.
16. B D Armstrong, D T Edwards, R J Wylde, S A Walker, and S Han, "A 200 GHz dynamic nuclear polarization spectrometer", Phys. Chem. Chem. Phys. 12, 5920, 2010.
17. A Macor et al, WO 2013/057688, "Over-moded Resonant Cavity for Magnetic Resonance Based on a Photonic Band Gap Structure", 33/345, April 2013.
18. K J Pike, T F Kemp, H Takahashi et al, "A spectrometer designed for 6.7 and 14.1 T DNP-enhanced solid-state MAS NMR using quasi-optical microwave transmission," J. Magn. Reson., 2012.
19. G Annino, WO 2013/000508, "Magnetic Resonance Hyperpolarization Probe Head", 33/62, January 2013.
20. F D Doty, "Probe Design and Construction," The Encyclopedia of NMR Vol. 6, Wiley, 3753-3762, 1996.
21. F D Doty, J Kulkarni, C Turner, G Entzminger, A Bielecki, "Using a cross-coil to reduce RF heating by an order of magnitude in triple-resonance multinuclear MAS at high fields", J. Magn. Reson., 182, 239-253, 2006.
22. P L Gor'kov, W W Brey and J R Long, "Probe Development for Biosolids NMR Spectroscopy", Electronic Encyclopedia of NMR, Wiley, 2007.
23. F D Doty, J Staab, G Entzminger, J B Spitzmesser, D Arcos, L L Holte, P D Ellis, "A High-Power H/C/N NMR Probe for Membrane Proteins", Presented at ANZMAG, Brisbane, 2013.
24. C Hayes, U.S. Pat. No. 4,642,569, "Shield for Decoupling RF and Gradient Coils in an NMR Apparatus", 324/318, 1987.
25. M Alecci and P Jezzard, "Characterization and Reduction of Gradient-induced Eddy Currents in the RF Shield of a TEM Resonator", Magn. Reson. in Med., 48:404-407, 2002.
26. F D Doty, "NMR MAS Inflow Bernoulli Bearing", 324/321, 2007.
27. F D Doty, G Entzminger, and A Yang, "Magnetism in HR NMR Probe Design—Part I: General Methods," Concepts in MR, (4), Vol 10(3), 133-156, 1998.
28. F D Doty, G Entzminger, and A Yang, "Magnetism in HR NMR Probe Design—Part II: HR-MAS, "Concepts in Magn. Reson., (4), 239-260, 1998.
29. N Zanche C Barmet, J A Nordmeyer-Massner, and K P Pruessmann, "NMR Probe for Measuring Magnetic Fields and Field Dynamics in MR Systems", MRM, 60, 176-186, 2008.
30. T R Eichhorn, M Haag, B van den Brandt, P Hautle, V V T Wenckebach, S Jannin, J J van der Klink, A Comment, "An apparatus for pulsed ESR and DNP experiments using optically excited triplet states down to liquid helium temperatures", *J. Magn. Reson.,* 234, 58-66, 2013.

I claim:
1. A tunable static Dynamic Nuclear Polarization probe for characterization of a sample by Dynamic Nuclear Polarization techniques suitable for use in an external polarizing field $B_0$ at Nuclear Magnetic Resonance frequency $f_N$ and electron paramagnetic resonance frequency $f_e$ of free-space wavelength $\lambda_0$, said probe characterized as comprising
 a sample cavity of transverse dimension greater than $2\lambda_0/3$ substantially bounded by a reflective side wall and reflective end surfaces,
 a tapered waveguide transition_1 having a small-end conical-section solid dielectric core at its smaller end,
 said sample cavity fed transversely through a sample iris near an axial center of its reflective cylindrical wall from a dielectric tip of said tapered transition_1,
 a tune cavity having an adjustable effective volume,
 a waveguide transition_2 connecting said tune cavity to the larger end of said tapered waveguide,
 said reflective side wall further characterized as being substantially reflective to electromagnetic radiation at frequency $f_e$ but substantially transparent to electromagnetic radiation at frequency $f_N$ and further characterized as being mechanically supported on an inside of a ceramic coilform, and
 an rf coil on the outside of said coilform.
2. The Dynamic Nuclear Polarization probe of claim 1 in which the effective volume of said tune cavity can be varied by a movable metallic rod extending into said tune cavity.
3. The Dynamic Nuclear Polarization probe of claim 1 further characterized as including two adjustment mecha- nisms so both the effective volume of said tune cavity and the effective centering of its fields with respect to said transition_2 can be adjusted.

4. The Dynamic Nuclear Polarization probe of claim 1 in which the effective volume of said tune cavity can be varied by a movable dielectric component extending into said tune cavity.

5. The Dynamic Nuclear Polarization probe of claim 1 in which said tune cavity is further characterized as being fed through a tune-cavity iris connected to the small end of a tapered waveguide transition_3 of minor radius greater than $\lambda_0/3$.

6. The Dynamic Nuclear Polarization probe of claim 1 in which said reflective side wall is further characterized as comprised of double-clad laminate with overlapping foil patches.

7. The Dynamic Nuclear Polarization probe of claim 1 in which a portion of said reflective end surfaces are located on removable dielectric plugs in the ends of a sample tube that fits inside said sample cavity.

8. The Dynamic Nuclear Polarization probe of claim 1 in which said sample cavity has length greater than $2\lambda_0$.

9. The Dynamic Nuclear Polarization probe of claim 1 in which said small-end conical-section dielectric core is of alumina.

10. The Dynamic Nuclear Polarization probe of claim 1 in which said first tapered waveguide further comprises a larger conical-section dielectric core adjacent to said small-end core, said larger core being made of a material of lower permittivity than that of said small-end core.

11. The Dynamic Nuclear Polarization probe of claim 1 in which said rf coil is a solenoid of at least two turns.

12. The Dynamic Nuclear Polarization probe of claim 1 in which said sample cavity is oriented such that its axis will be inclined at an angle between 55° and 90° when inserted into the bore of a superconducting magnet.

13. The Dynamic Nuclear Polarization probe of claim 1 further characterized as comprising
an input microwave port connected to an overmoded circular waveguide of radius greater than $1.2\lambda_0$,
a fundamental-mode circular waveguide of radius less than $0.8\lambda_0$, and
a third tapered waveguide between said overmoded waveguide and said fundamental-mode waveguide.

14. The Dynamic Nuclear Polarization probe of claim 1 further characterized as comprising a small tube connected to transition_2 for optical irradiation.

15. The Dynamic Nuclear Polarization probe of claim 1 further characterized as including additional coils and capacitors to tune said rf coil to three Nuclear Magnetic Resonance frequencies simultaneously.

16. The Dynamic Nuclear Polarization probe of claim 1 in which said reflective side wall is further characterized as a conductive film of as alloy including a noble metal and having resistivity greater than 4 µΩcm.

17. The Dynamic Nuclear Polarization probe of claim 1 in which said sample cavity iris has minimum diameter greater than $\lambda_d/2$, where $\lambda_d$ equals $\lambda_0$ divided by the square root of the dielectric constant of said solid dielectric core.

18. A sample cell for Dynamic Nuclear Polarization comprising a dielectric tube of outer radius r, length L, and wall w, with metallization covering its end surfaces and extending toward the center on a cylindrical surface a distance greater than w and less than L/3, said metallization having thickness greater than 0.1 micron and less than 2 microns, said dielectric selected from the set of quartz, silicon nitride, mullite, and aluminum oxide, and further comprising dielectric plugs within the ends of the dielectric tube.

19. A method of performing a Dynamic Nuclear Polarization experiment that includes loading sample material onto Dynamic Nuclear Polarization sample trays, inserting a stack of the loaded trays into a Dynamic Nuclear Polarization sample tube, inserting a reflective dielectric plug into an end of the sample tube, inserting the sample tube into a cylindrical Dynamic Nuclear Polarization sample cavity in a Dynamic Nuclear Polarization probe head, inserting the Dynamic Nuclear Polarization probe head into a polarizing magnet, and performing a Dynamic Nuclear Polarization measurement,
said Dynamic Nuclear Polarization sample trays further characterized as being of a material of relative permittivity less than 3.5, having depth less than $\lambda_0/2$ and each lateral dimension greater than $\lambda_0/2$ but less than $20\lambda_0$,
said reflective dielectric plug further characterized as having an end surface that is substantially reflective to electromagnetic radiation at frequency $f_e$.

* * * * *